US012768911B2

(12) United States Patent
Watanabe et al.

(10) Patent No.: US 12,768,911 B2
(45) Date of Patent: Oct. 20, 2026

(54) MAGNETIC SENSOR DEVICE

(71) Applicant: TDK Corporation, Tokyo (JP)

(72) Inventors: Kazuya Watanabe, Tokyo (JP); Hiraku Hirabayashi, Tokyo (JP); Takehiro Isoda, Tokyo (JP)

(73) Assignee: TDK CORPORATION, Tokyo (JP)

( * ) Notice: Subject to any disclaimer, the term of this patent is extended or adjusted under 35 U.S.C. 154(b) by 156 days.

(21) Appl. No.: 18/929,851

(22) Filed: Oct. 29, 2024

(65) Prior Publication Data

US 2025/0155526 A1 May 15, 2025

(30) Foreign Application Priority Data

Nov. 13, 2023 (JP) ................................ 2023-192989

(51) Int. Cl.
*G01R 33/09* (2006.01)
*G01R 33/00* (2006.01)

(52) U.S. Cl.
CPC ..... *G01R 33/0052* (2013.01); *G01R 33/0005* (2013.01); *G01R 33/0035* (2013.01); *G01R 33/09* (2013.01)

(58) Field of Classification Search
CPC ............ G01R 33/0005; G01R 33/0035; G01R 33/052; G01R 33/09
See application file for complete search history.

(56) References Cited

U.S. PATENT DOCUMENTS

2020/0191547 A1* 6/2020 Watanabe .............. G01R 33/09
2021/0181241 A1 6/2021 Ota et al.

* cited by examiner

*Primary Examiner* — Alesa Allgood
(74) *Attorney, Agent, or Firm* — Oliff PLC

(57) ABSTRACT

A magnetic field generator is configured to generate a magnetic field to be applied to the magnetic sensor. A conductor layer of the magnetic field generator includes a first end, a second end, a plurality of main wirings, a first sub-wiring, and a second sub-wiring. The first sub-wiring includes a plurality of first paths from the first end to each of the plurality of main wirings through a plurality of first coupling portions. The second sub-wiring includes a plurality of second paths from the second end to each of the plurality of main wirings through a plurality of second coupling portions. The number of the plurality of first coupling portions through which each of any two of the first paths passes is the same. The number of the plurality of second coupling portions through which each of any two of the second paths passes is the same.

16 Claims, 17 Drawing Sheets

MAGNETIC SENSOR DEVICE

CROSS REFERENCE TO RELATED APPLICATION

This application claims the benefit of Japanese Priority Patent Application No. 2023-192989 filed on Nov. 13, 2023, the entire contents of which are incorporated herein by reference.

BACKGROUND

The technology relates to a magnetic sensor device including a magnetic field generator.

In recent years, magnetic sensors have been used in various applications. A known magnetic sensor is one that uses a spin-valve magnetoresistive element. The spin-valve magnetoresistive element includes a magnetization pinned layer having a magnetization whose direction is fixed, a free layer having a magnetization whose direction is variable depending on a direction of an applied magnetic field, and a gap layer located between the magnetization pinned layer and the free layer.

In the spin-valve magnetoresistive element, a resistance changes with an angle that a magnetization direction of the free layer forms with respect to a magnetization direction of the magnetization pinned layer. The resistance is at its minimum value when the angle is 0°, and at its maximum value when the angle is 180°. To improve a detection accuracy of the magnetic sensor, it is desirable to align the magnetization direction of the free layer before using the magnetic sensor.

U.S. Patent Application Publication No. 2021/0181241 A1 discloses a current detection device and a magnetic field detection device. Each of the current detection device and the magnetic field detection device includes a magnetoresistive element and a coil. In these devices, a magnetic field is generated around the coil by supplying a current to the coil. The generated magnetic field is used to orient the magnetization direction of the magnetization free layer of the magnetoresistive element in a predetermined direction.

A magnetic sensor includes a plurality of magnetoresistive elements. When a magnetic field is applied to the plurality of magnetoresistive elements using a magnetic field generator such as a coil, it is desirable that a uniform magnetic field be applied to each of the plurality of magnetoresistive elements. For this purpose, it is desirable that the current density in conductors constituting the magnetic field generator be uniform.

SUMMARY

A magnetic sensor device according to one example embodiment of the technology includes a magnetic sensor, and a magnetic field generator configured to generate a magnetic field to be applied to the magnetic sensor. The magnetic field generator according to one example embodiment of the technology is configured to generate a magnetic field for inspection to be applied to the magnetic sensor. The magnetic field generator includes a conductor layer made of a conductive material. The conductor layer includes a first end, a second end, a plurality of main wirings for generating the magnetic field, the plurality of main wirings provided between the first end and the second end and separated from each other, a first sub-wiring electrically connecting the first end to the plurality of main wirings. and a second sub-wiring electrically connecting the second end to the plurality of main wirings.

The first sub-wiring includes a plurality of first paths from the first end to each of the plurality of main wirings. The second sub-wiring includes a plurality of second paths from the second end to each of the plurality of main wirings. Each of the plurality of first paths passes through a plurality of first coupling portions from each of which the first sub-wiring branches off. Each of the plurality of second paths passes through a plurality of second coupling portions from each of which the second sub-wiring branches off. The number of the plurality of first coupling portions through which each of any two of the plurality of first paths passes is the same. The number of the plurality of second coupling portions through which each of any two of the plurality of second paths passes is the same.

Other objects, features, and advantages of the technology will appear more fully from the following description.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
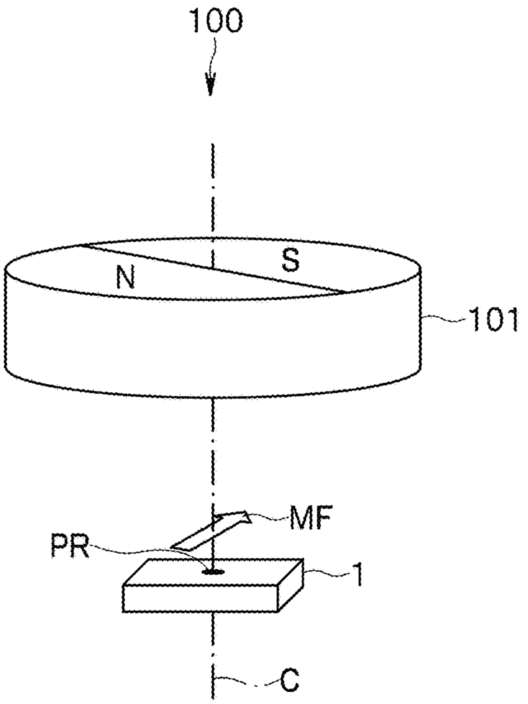
FIG. 1 is a perspective view showing a magnetic sensor system in a first example embodiment of the technology.

An object of the technology is to provide a magnetic sensor device including a magnetic sensor and a magnetic field generator, in which a uniform magnetic field can be applied to the magnetic sensor by the magnetic field generator.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order.

First Example Embodiment

First, a schematic configuration of a magnetic sensor system including a magnetic sensor device according to a first example embodiment of the technology will be described with reference to FIG. 1. FIG. 1 is a perspective view showing a magnetic sensor system 100 in the example embodiment. The magnetic sensor system 100 in the example embodiment includes a magnetic sensor device 1 according to the example embodiment and a magnetic field generator 101. The magnetic field generator 101 generates a target magnetic field MF, which is a magnetic field to be detected by the magnetic sensor device 1.

The magnetic field generator 101 in the example embodiment is a cylindrical magnet. The magnetic field generator 101 includes an N pole and an S pole symmetrically arranged about an imaginary plane including the central axis of the cylinder. The magnetic field generator 101 rotates about the central axis of the cylinder. As a result, a direction of the target magnetic field MF generated by the magnetic field generator 101 rotates about a rotation axis C that includes the central axis of the cylinder.

The magnetic sensor device 1 is located at a position where the target magnetic field MF at a predetermined reference position PR can be detected. The reference position PR may be on the rotation axis C. In the following description, the reference position PR is assumed to be on the rotation axis C. The magnetic sensor device 1 detects the target magnetic field MF generated by the magnetic field generator 101 and generates at least one detection signal. The at least one detection signal has a correspondence with a relative position of the magnetic field generator 101 relative to the magnetic sensor device 1, in particular a rotational position of the magnetic field generator 101.

Here, an imaginary plane parallel to one end face of the magnetic field generator 101 and including the reference position PR is referred to as a reference plane. In the reference plane, the direction of the target magnetic field MF rotates about the reference position PR. A reference direction is located in the reference plane and intersects the reference position PR. In the following description, the direction of the target magnetic field MF at the reference position PR refers to a direction located in the reference plane. The magnetic sensor device 1 is configured to generate an angle detection value θs having a correspondence with the direction of the target magnetic field MF at the reference position PR.

Figure 2:
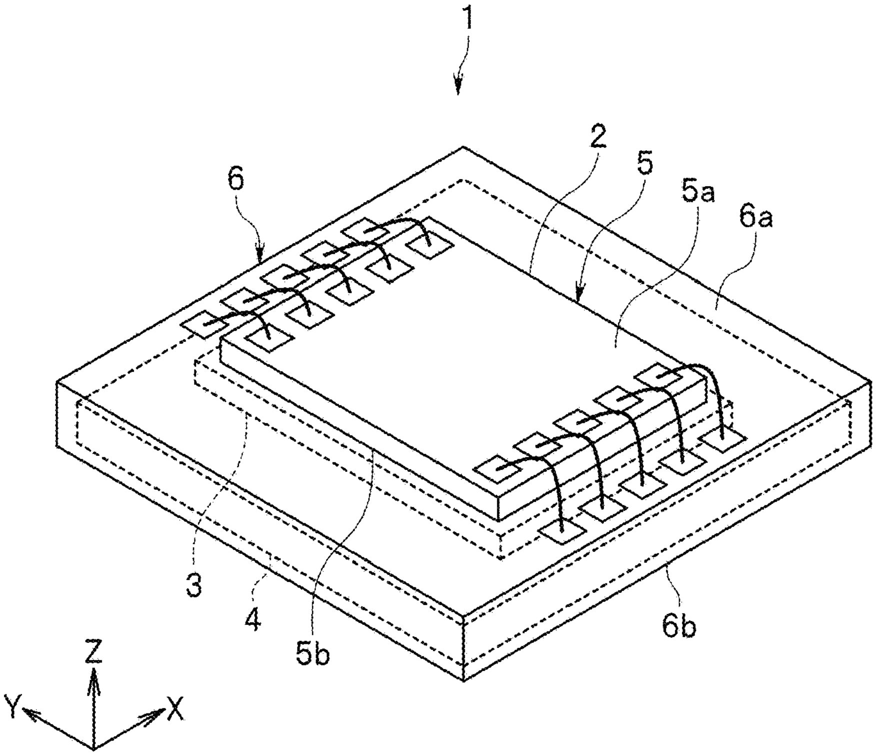
FIG. 2 is a perspective view showing a magnetic sensor device according to the first example embodiment of the technology.
Figure 3:
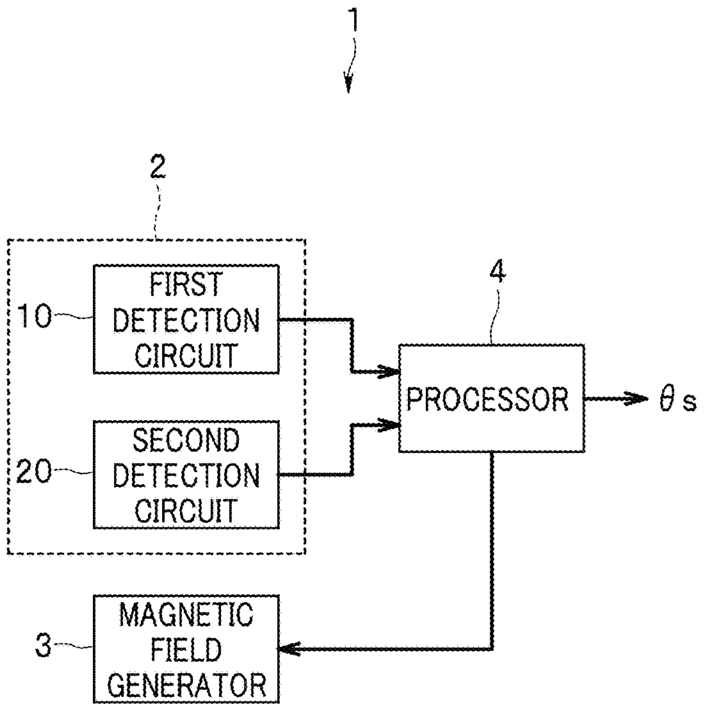
FIG. 3 is a functional block diagram showing a configuration of the magnetic sensor device according to the first example embodiment of the technology.

Next, a configuration of the magnetic sensor device 1 will be described with reference to FIG. 2 and FIG. 3. FIG. 2 is a perspective view showing the magnetic sensor device 1. FIG. 3 is a functional block diagram showing the configuration of the magnetic sensor device 1. As shown in FIG. 2 and FIG. 3, the magnetic sensor device 1 includes a magnetic sensor 2 configured to detect the target magnetic field MF (see FIG. 1) and generate at least one detection signal, a magnetic field generator 3 configured to generate a magnetic field to be applied to the magnetic sensor 2, and a processor 4 configured to generate the angle detection value θs based on the at least one detection signal. The processor 4 is configured, for example, by an application-specific integrated circuit (ASIC).

In the example embodiment, the magnetic field generator 3 and the processor 4 are configured to be integrated into a single electronic component. The magnetic sensor 2 is configured to be an electronic component separate from the magnetic field generator 3 and the processor 4. Hereinafter, the electronic component including the magnetic sensor 2 is referred to as a first electronic component 5 and the electronic component including the magnetic field generator 3 and the processor 4 is referred to as a second electronic component 6. The magnetic sensor device 1 may include the first electronic component 5 and the second electronic component 6.

Each of the first and second electronic components 5 and 6 has a form of a rectangular parallelepiped chip. The first electronic component 5 has a top surface 5*a* and a bottom surface 5*b* located on opposite sides of each other, and four side surfaces connecting the top surface 5*a* and the bottom surface 5*b*. The second electronic component 6 has a top surface 6*a* and a bottom surface 6*b* located on opposite sides of each other, and four side surfaces connecting the top surface 6*a* and the bottom surface 6*b*. The first electronic component 5 is mounted on the top surface 6*a* of the second electronic component 6 in an orientation where the bottom surface 5$b$ of the first electronic component 5 faces the top surface 6$a$ of the second electronic component 6. The first electronic component 5 is bonded to the second electronic component 6 by an adhesive, for example.

In the second electronic component 6, the magnetic field generator 3 is stacked on the processor 4. In a state where the first electronic component 5 is mounted on the second electronic component 6, the magnetic field generator 3 is located between the magnetic sensor 2 and the processor 4.

Here, an X direction, a Y direction, and a Z direction are defined as shown in FIG. 2. The X, Y, and Z directions are orthogonal to each other. In the example embodiment, a direction that is perpendicular to the top surface 5$a$ of the first electronic component 5 and is from the bottom surface 5$b$ to the top surface 5$a$ of the first electronic component 5 is the Z direction. A direction opposite to the X direction is a −X direction, a direction opposite to the Y direction is a −Y direction, and a direction opposite to the Z direction is a −Z direction. The magnetic sensor 2 and the magnetic field generator 3 can be said to be stacked in a direction parallel to the Z direction.

Hereinafter, the term "above" refers to positions located forward of a reference position in the Z direction, and "below" refers to positions opposite from the "above" positions with respect to the reference position. For each component of the magnetic sensor device 1, the term "top surface" refers to a surface located at the end thereof in the Z direction, and "bottom surface" refers to a surface located at the end thereof in the −Z direction. The expression "when seen in the Z direction" means that a target object is seen from a position away in the Z direction.

The first electronic component 5 includes a plurality of first pads (electrode pads) provided on the top surface 5$a$. The second electronic component 6 includes a plurality of second pads (electrode pads) provided on the top surface 6$a$. In the magnetic sensor device 1, two corresponding pads of the plurality of first pads and the plurality of second pads are connected to each other by bonding wires.

The magnetic sensor 2 includes a first detection circuit 10 and a second detection circuit 20. The first and second detection circuits 10 and 20 and the processor 4 are connected via the plurality of first pads, the plurality of second pads, and the plurality of bonding wires.

Each of the first and second detection circuits 10 and 20 includes a plurality of magnetic detection elements. In the example embodiment in particular, the plurality of magnetic detection elements are a plurality of magnetoresistive elements. The magnetoresistive elements are hereinafter referred to as MR elements.

The first detection circuit 10 detects a component of the target magnetic field MF in a first direction and generates at least one first detection signal having a correspondence with the component. The second detection circuit 20 detects a component of the target magnetic field MF in a second direction and generates at least one second detection signal having a correspondence with the component. In the example embodiment in particular, the first direction is a direction parallel to the X direction and the second direction is a direction parallel to the Y direction.

The processor 4 is configured to generate the angle detection value $\theta s$ based on the at least one first detection signal and the at least one second detection signal.

The magnetic field generator 3 is configured to generate a first magnetic field and a second magnetic field. The magnetic field generator 3 is supplied with a driving current from the processor 4 to generate the first magnetic field and the second magnetic field. The driving current may be a direct current or an alternating current. When the direct current is supplied to the magnetic field generator 3, a direction and a strength of each of the first and second magnetic fields are constant. When the alternating current is supplied to the magnetic field generator 3, the direction and the strength of each of the first and second magnetic fields vary periodically.

The first magnetic field includes a first magnetic field component to be applied to the first detection circuit 10. The second magnetic field includes a second magnetic field component to be applied to the second detection circuit 20. A direction of the first magnetic field component is a direction parallel to the first direction, that is, the X or −X direction. A direction of the second magnetic field component is a direction parallel to the second direction, that is, the Y or −Y direction. An operation of the magnetic field generator 3 is controlled by the processor 4, for example.

The first magnetic field may be used to measure the sensitivity of the first detection circuit 10, for example. Specifically, the sensitivity of the first detection circuit 10 is measured by measuring the magnitude of the at least one first detection signal while varying the strength of the first magnetic field, for example. The second magnetic field may be used to measure the sensitivity of the second detection circuit 20, for example. Specifically, the sensitivity of the second detection circuit 20 is measured by measuring the magnitude of the at least one second detection signal while varying the strength of the second magnetic field, for example.

Figure 4:
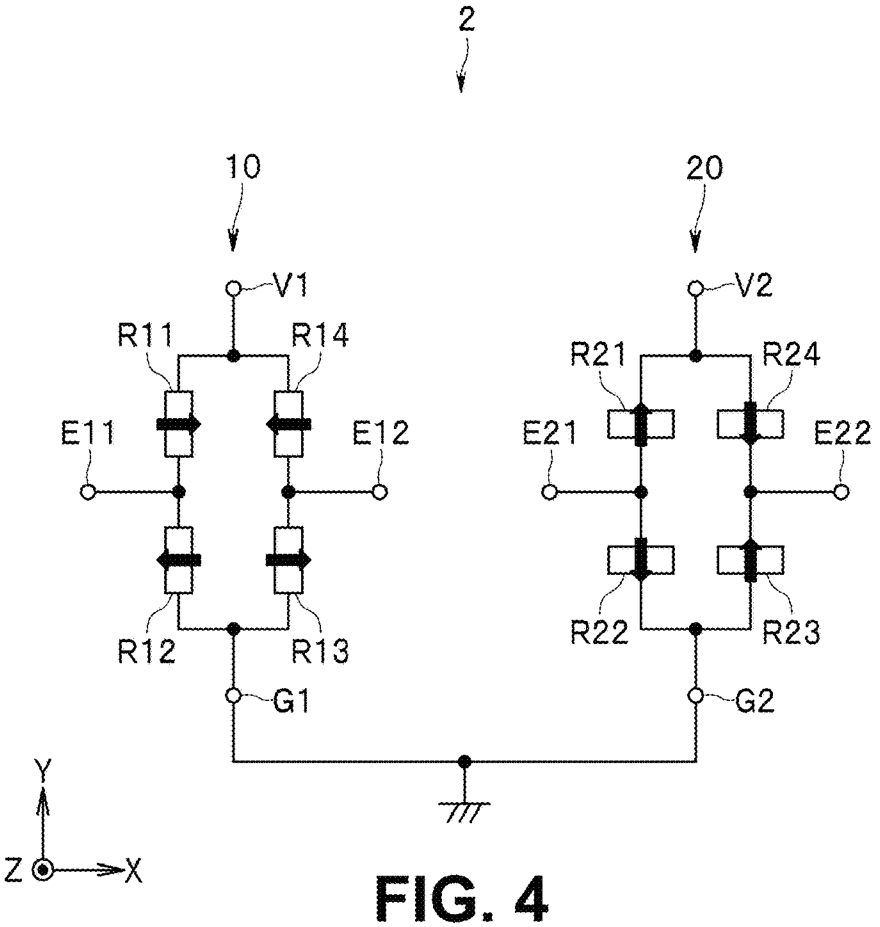
FIG. 4 is a circuit diagram showing a circuit configuration of the magnetic sensor in the first example embodiment of the technology.

Next, a circuit configuration of the magnetic sensor 2 will be described with reference to FIG. 4. FIG. 4 is a circuit diagram showing the circuit configuration of the magnetic sensor 2.

The first detection circuit 10 includes four resistor sections R11, R12, R13, and R14, a power supply port V1, a ground port G1, and two output ports E11 and E12. The resistor section R11 is provided between the power supply port V1 and the output port E11. The resistor section R12 is provided between the output port E11 and the ground port G1. The resistor section R13 is provided between the output port E12 and the ground port G1. The resistor section R14 is provided between the power supply port V1 and the output port E12. A voltage or current of a predetermined magnitude is applied to the power supply port V1. The ground port G1 is connected to the ground.

The second detection circuit 20 includes four resistor sections R21, R22, R23, and R24, a power supply port V2, a ground port G2, and two output ports E21 and E22. The resistor section R21 is provided between the power supply port V2 and the output port E21. The resistor section R22 is provided between the output port E21 and the ground port G2. The resistor section R23 is provided between the output port E22 and the ground port G2. The resistor section R24 is provided between the power supply port V2 and the output port E22. A voltage or current of a predetermined magnitude is applied to the power supply port V2. The ground port G2 is connected to the ground.

Figure 5:
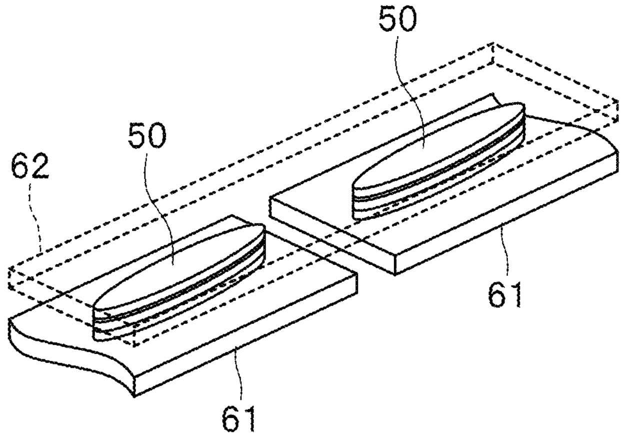
FIG. 5 is a perspective view showing a part of a resistor section in the first example embodiment of the technology.
Figure 6:
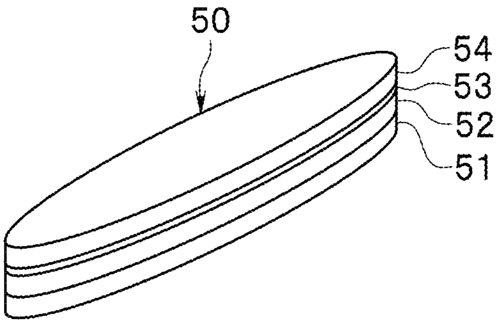
FIG. 6 is a perspective view showing a magnetoresistive element in the first example embodiment of the technology.

The resistor sections R11 to R14 and R21 to R24 will be described here with reference to FIG. 5 and FIG. 6. Each of the resistor sections R11 to R14 and R21 to R24 includes a plurality of MR elements 50. FIG. 5 is a perspective view showing a part of one resistor section of the resistor sections R21 to R24. FIG. 6 is a perspective view showing the MR element 50.

Each of the resistor sections R11 to R14 and R21 to R24 further includes a plurality of lower electrodes 61 and a plurality of upper electrodes 62. Each of the lower electrodes 61 has a long slender shape. A gap is formed between the two adjacent lower electrodes 61 in a longitudinal direction of the lower electrodes 61. As shown in FIG. 5, the MR elements 50 are disposed near both ends in the longitudinal direction on the top surface of each of the lower electrodes 61. The plurality of upper electrodes 62 are disposed on the plurality of MR elements 50. Each of the upper electrodes 62 has a long slender shape and are disposed on the two adjacent lower electrodes 61 in the longitudinal direction of the lower electrodes 61 to electrically connect the two adjacent MR elements 50. With this configuration, each of the resistor sections R11 to R14 and R21 to R24 includes the plurality of MR elements 50 connected in series by the plurality of lower electrodes 61 and the plurality of upper electrodes 62.

In the example embodiment, each of the plurality of MR elements 50 is a spin-valve MR element. The spin-valve MR element includes a magnetization pinned layer 52 having a magnetization whose direction is fixed, a free layer 54 having a magnetization whose direction is variable depending on the direction of the target magnetic field MF, and a gap layer 53 located between the magnetization pinned layer 52 and the free layer 54. The spin-valve MR element may be a tunneling magnetoresistive (TMR) element, or a giant magnetoresistive (GMR) element. In the TMR element, the gap layer 53 is a tunnel barrier layer. In the GMR element, the gap layer 53 is a nonmagnetic conductive layer. In the spin-valve MR element, the resistance changes with the angle that the magnetization direction of the free layer 54 forms with respect to the magnetization direction of the magnetization pinned layer 52, and the resistance is at its minimum value when the angle is 0° and at its maximum value when the angle is 180°. In each of the MR elements 50, the free layer 54 has a shape anisotropy in which a direction of a magnetization easy axis is a direction orthogonal to the magnetization direction of the magnetization pinned layer 52.

The MR element 50 further includes an antiferromagnetic layer 51. The antiferromagnetic layer 51, the magnetization pinned layer 52, the gap layer 53, and the free layer 54 are stacked in this order from the lower electrodes 61 side. The arrangement of the layers 51 to 54 in the MR element 50 may be in a vertically reverse order to the arrangement shown in FIG. 6. The antiferromagnetic layer 51 is made of an antiferromagnetic material and is in exchange coupling with the magnetization pinned layer 52 to fix the magnetization direction of the magnetization pinned layer 52. Note that the magnetization pinned layer 52 may be a so-called self-pinned layer (Synthetic Ferri Pinned layer, SFP layer). The self-pinned layer has a stacked ferri structure in which a ferromagnetic layer, a nonmagnetic intermediate layer, and a ferromagnetic layer are stacked, and the two ferromagnetic layers are antiferromagnetically coupled. In a case where the magnetization pinned layer 52 is a self-pinned layer, the antiferromagnetic layer 51 may be omitted.

In FIG. 4, the filled arrows represent the magnetization direction of the magnetization pinned layer 52 in each of the resistor sections R11 to R14 and R21 to R24. In the example shown in FIG. 4, the magnetization direction of the magnetization pinned layer 52 in each of the resistor sections R11 and R13 is the X direction. The magnetization direction of the magnetization pinned layer 52 in each of the resistor sections R12 and R14 is the −X direction. The free layer 54 in each of the resistor sections R11 to R14 has a shape anisotropy in which the direction of the magnetization easy axis is parallel to the Y direction.

The magnetization direction of the magnetization pinned layer 52 in each of the resistor sections R21 and R23 is the Y direction. The magnetization direction of the magnetization pinned layer 52 in each of the resistor sections R22 and R24 is the −Y direction. The free layer 54 in each of the resistor sections R21 to R24 has a shape anisotropy in which the direction of the magnetization easy axis is parallel to the X direction.

In the first detection circuit 10, the electric potential of a connection point of the resistor sections R11 and R12, that is, the electric potential of the output port E11, and the electric potential of a connection point of the resistor sections R13 and R14, that is, the electric potential of the output port E12, change according to the strength of the component of the target magnetic field MF in the first direction (the direction parallel to the X direction). The first detection circuit 10 may generate a signal corresponding to the electric potential of the output port E11 and a signal corresponding to the electric potential of the output port E12, each as the first detection signal. Alternatively, the first detection circuit 10 may generate a signal corresponding to the potential difference between the output ports E11 and E12 as the first detection signal. In this case, the first detection circuit 10 may further include a differential amplifier (difference detector) that outputs the signal corresponding to the potential difference between the output ports E11 and E12 as the first detection signal.

In the second detection circuit 20, the electric potential of a connection point of the resistor sections R21 and R22, that is, the electric potential of the output port E21, and the electric potential of a connection point of the resistor sections R23 and R24, that is, the electric potential of the output port E22, change according to the strength of the component of the target magnetic field MF in the second direction (the direction parallel to the Y direction). The second detection circuit 20 may generate a signal corresponding to the electric potential of the output port E21 and a signal corresponding to the electric potential of the output port E22, each as the second detection signal. Alternatively, the second detection circuit 20 may generate a signal corresponding to the potential difference between the output ports E21 and E22 as the second detection signal. In this case, the second detection circuit 20 may further include a differential amplifier that outputs the signal corresponding to the potential difference between the output ports E21 and E22 as the second detection signal.

Here, a method of generating the angle detection value θs will be described. First, a case will be described in which the first detection circuit 10 generates the signal corresponding to the electric potential of the output port E11 and the signal corresponding to the electric potential of the output port E12, each as the first detection signal, and the second detection circuit 20 generates the signal corresponding to the electric potential of the output port E21 and the signal corresponding to the electric potential of the output port E22, each as the second detection signal. The processor 4 first generates a first signal S1 by an arithmetic including determining a difference between the two first detection signals and generates a second signal S2 by an arithmetic including determining a difference between the two second detection signals. The processor 4 may be configured to be able to correct an amplitude, a phase, and an offset of each of the first and second signals S1 and S2.

The processor 4 then calculates the angle detection value θs within the range equal to or greater than 0° to less than 360°, for example, according to the following equation (1). Note that "a tan" represents the arctangent.

$$\theta s = a\tan(S2/S1) \quad (1)$$

Next, a case will be described in which the first detection circuit 10 generates the signal corresponding to the potential difference between the output ports E11 and E12 as the first detection signal and the second detection circuit 20 generates the signal corresponding to the potential difference between the output ports E21 and E22 as the second detection signal. In this case, the processor 4 acquires a signal corresponding to the first detection signal as the first signal S1 and a signal corresponding to the second detection signal as the second signal S2. The processor 4 may acquire the first and second detection signals as the first and second signals S1 and S2, or two signals corrected for at least one of the amplitude, the phase, and the offset of the first and second detection signals as the first and second signals S1 and S2. The processor 4 then calculates the angle detection value θs within the range equal to or greater than 0° to less than 360° according to the equation (1).

Figure 7:
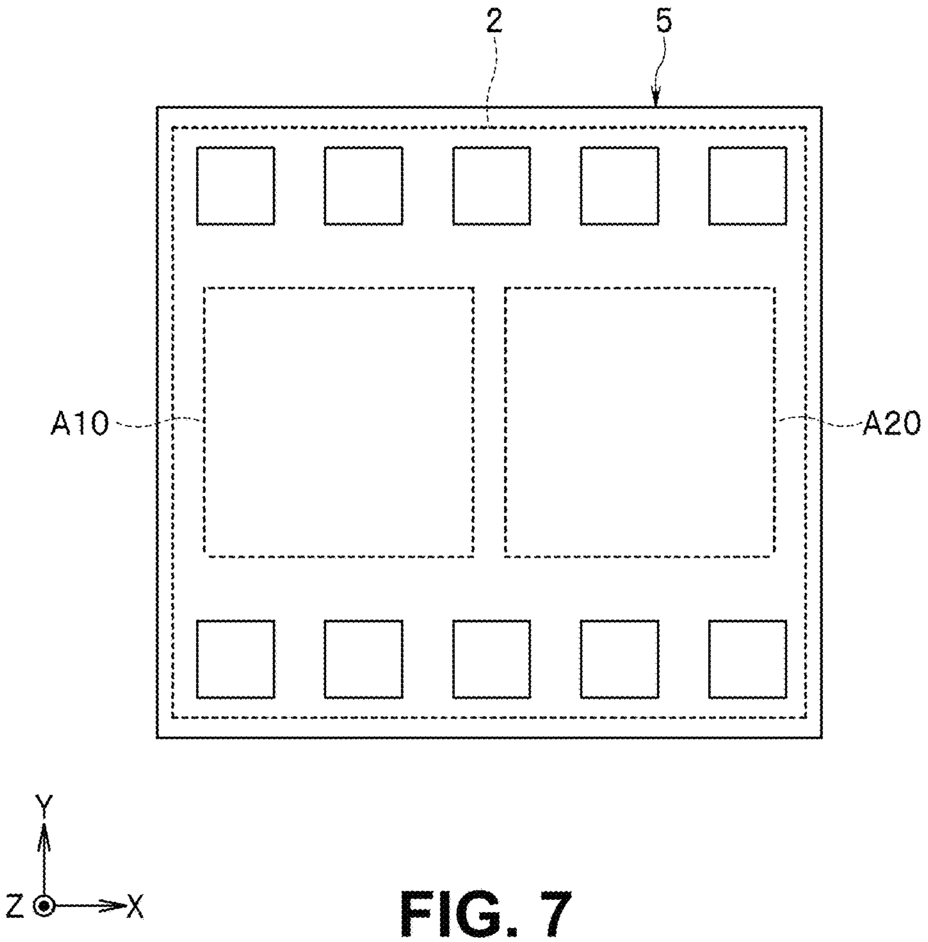
FIG. 7 is a plan view showing a first electronic component in the first example embodiment of the technology.
Figure 8:
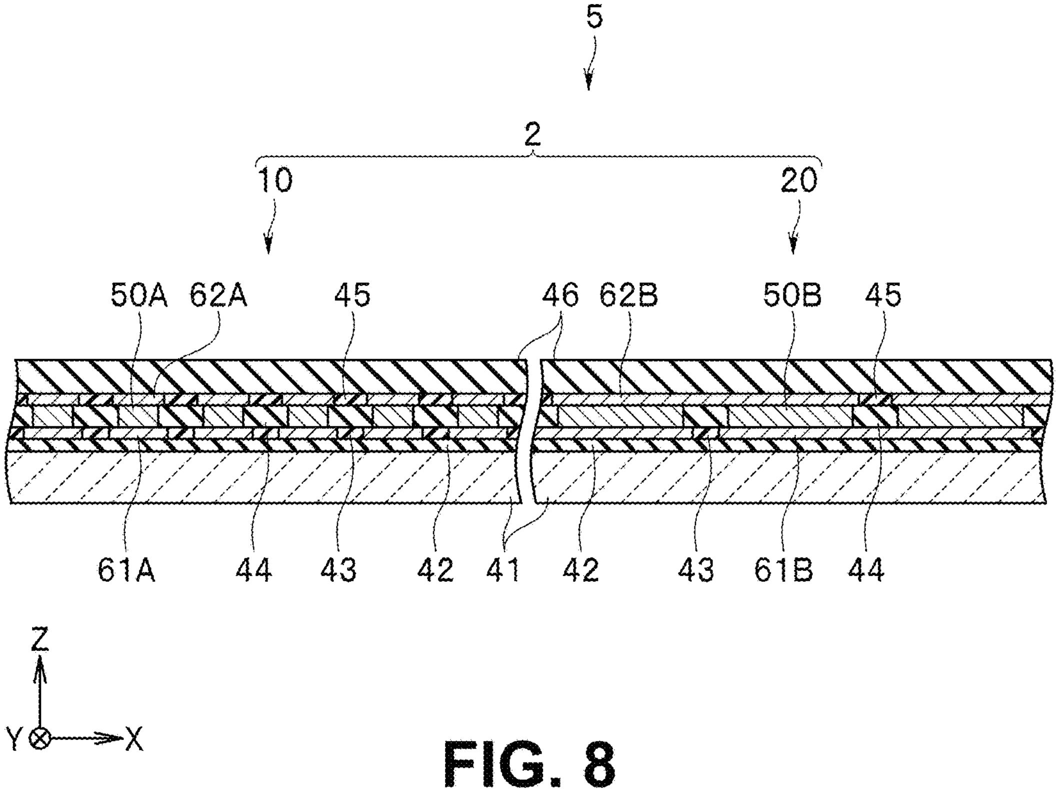
FIG. 8 is a cross-sectional view showing the first electronic component in the first example embodiment of the technology.

Next, a configuration of the first electronic component 5 will be described with reference to FIG. 7 and FIG. 8. FIG. 7 is a plan view showing the first electronic component 5. FIG. 8 is a cross-sectional view showing the first electronic component 5.

In FIG. 7, a rectangular area denoted by the reference sign A10 indicates an area where the plurality of MR elements 50 constituting the resistor sections R11 to R14 of the first detection circuit 10 are arranged. A rectangular area denoted by the reference sign A20 indicates an area where the plurality of MR elements 50 constituting the resistor sections R21 to R24 of the second detection circuit 20 are arranged. In the example shown in FIG. 7, the areas A10 and A20 are aligned in this order in the X direction. Note that the areas A10 and A20 may be aligned in the Y direction. Alternatively, at least one of the areas A10 and A20 may include a plurality of partial areas located away from each other.

Here, the plurality of MR elements 50 constituting the resistor sections R11 to R14 of the first detection circuit 10 are denoted by the reference sign 50A, the plurality of lower electrodes 61 connected to the plurality of MR elements 50A are denoted by the reference sign 61A, and the plurality of upper electrodes 62 connected to the plurality of MR elements 50A are denoted by the reference sign 62A. The plurality of MR elements 50 constituting the resistor sections R21 to R24 of the second detection circuit 20 are denoted by the reference sign 50B, the plurality of lower electrodes 61 connected to the plurality of MR elements 50B are denoted by the reference sign 61B, and the plurality of upper electrodes 62 connected to the plurality of MR elements 50B are denoted by the reference sign 62B. The first electronic component 5 includes the plurality of MR elements 50A, the plurality of MR elements 50B, the plurality of lower electrodes 61A, the plurality of lower electrodes 61B, the plurality of upper electrodes 62A, and the plurality of upper electrodes 62B.

The first electronic component 5 further includes a substrate 41 and insulating layers 42, 43, 44, 45, and 46. The insulating layer 42 is disposed on the substrate 41. The plurality of lower electrodes 61A and the plurality of lower electrodes 61B are disposed on the insulating layer 42. The insulating layer 43 is disposed around the plurality of lower electrodes 61A and around the plurality of lower electrodes 61B on the insulating layer 42. The plurality of MR elements 50A are disposed on the plurality of lower electrodes 61A. The plurality of MR elements 50B are disposed on the plurality of lower electrodes 61B. The insulating layer 44 is disposed around the plurality of MR elements 50A and around the plurality of MR elements 50B on the insulating layer 43, the plurality of lower electrodes 61A, and the plurality of lower electrodes 61B.

The plurality of upper electrodes 62A are disposed on the insulating layer 44 and the plurality of MR elements 50A. The plurality of upper electrodes 62B are disposed on the insulating layer 44 and the plurality of MR elements 50B. The insulating layer 45 is disposed around the plurality of upper electrodes 62A and around the plurality of upper electrodes 62B on the insulating layer 44. The insulating layer 46 is disposed on the insulating layer 45, the plurality of upper electrodes 62A, and the plurality of upper electrodes 62B.

Figure 9:
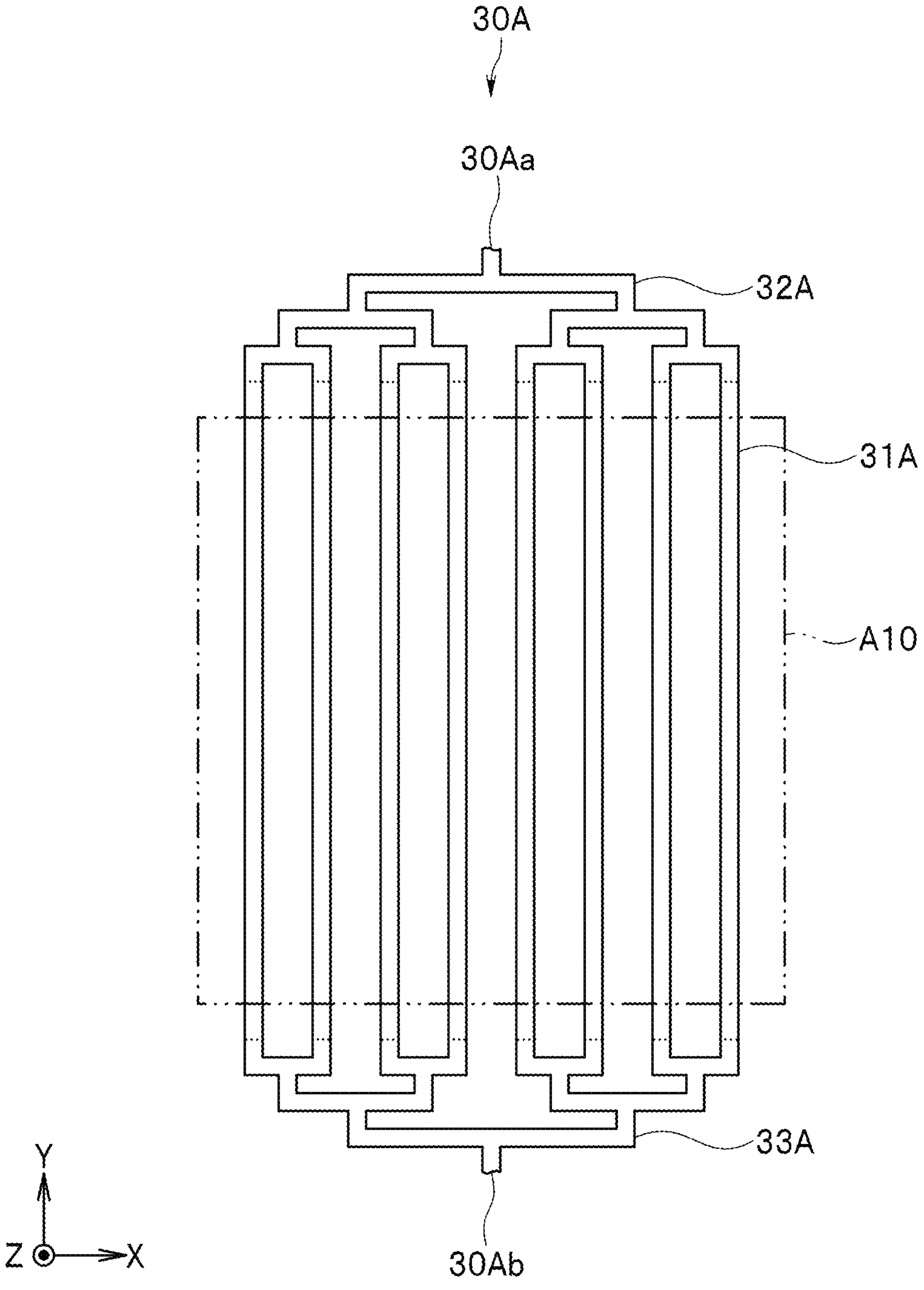
FIG. 9 is a plan view showing a first conductor layer in the first example embodiment of the technology.
Figure 10:
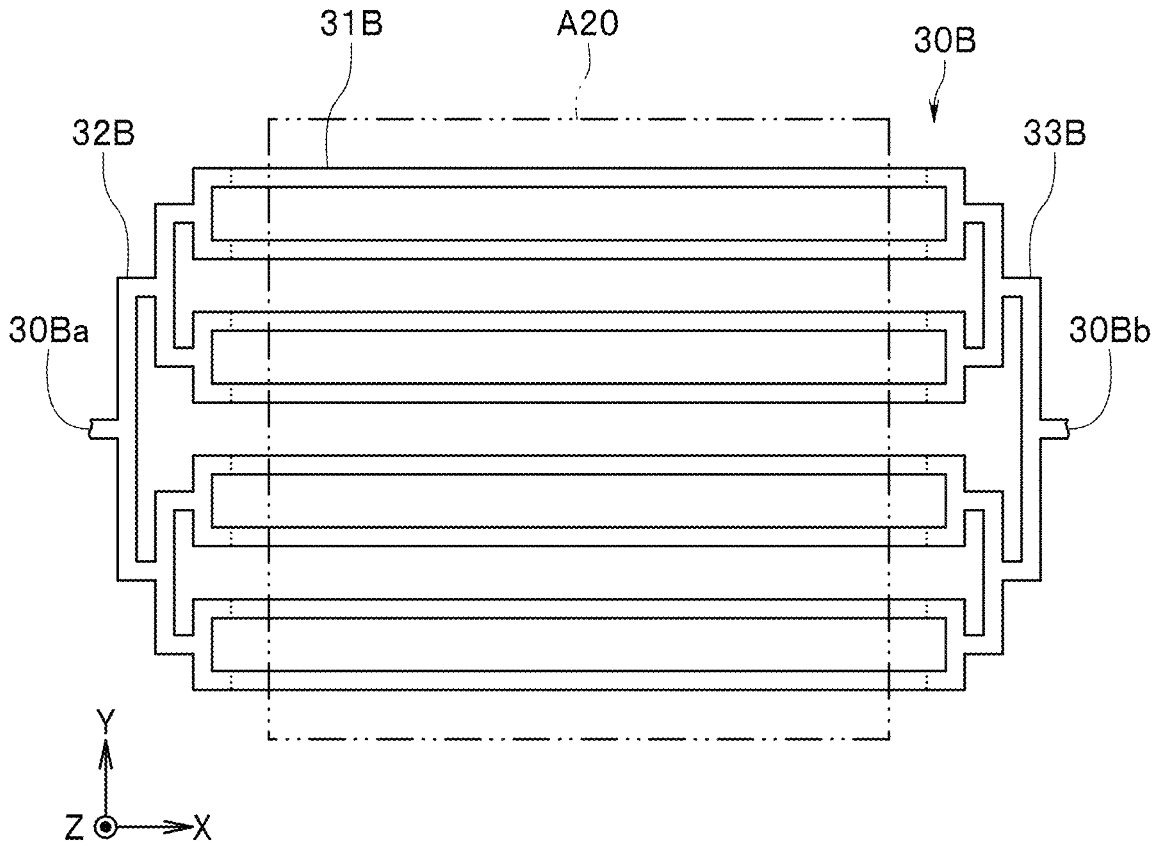
FIG. 10 is a plan view showing a second conductor layer in the first example embodiment of the technology.

Next, the magnetic field generator 3 will be described with reference to FIG. 9 and FIG. 10. FIG. 9 is a plan view showing a first conductor layer in the example embodiment. FIG. 10 is a plan view showing a second conductor layer in the example embodiment.

The magnetic field generator 3 includes a first conductor layer 30A and a second conductor layer 30B each made of a conductive material such as Cu, Au, or Al. The first conductor layer 30A is configured to generate the first magnetic field including the first magnetic field component to be applied to the first detection circuit 10. The second conductor layer 30B is configured to generate the second magnetic field including the second magnetic field component to be applied to the second detection circuit 20.

As shown in FIG. 9, the first conductor layer 30A includes a first end 30Aa, a second end 30Ab, a plurality of main wirings 31A provided between the first end 30Aa and the second end 30Ab and separated from each other, a first sub-wiring 32A electrically connecting the first end 30Aa to the plurality of main wirings 31A, and a second sub-wiring 33A electrically connecting the second end 30Ab to the plurality of main wirings 31A. The first end 30Aa and the second end 30Ab are each connected to the processor 4 (see FIG. 3).

The area A10 in which the plurality of MR elements 50A constituting the resistor sections R11 to R14 of the first detection circuit 10 are arranged overlaps the plurality of main wirings 31A when seen in the Z direction. Also, the area A10 is located between the first sub-wiring 32A and the second sub-wiring 33A when seen in the Z direction. In other words, the plurality of MR elements 50A may be located between the first sub-wiring 32A and the second sub-wiring 33A when seen in the Z direction. In the area A10, the strength of the first magnetic field component is the same or substantially the same. Accordingly, the strength of the first magnetic field component applied to each of the plurality of MR elements 50A is the same or substantially the same.

The plurality of main wirings 31A are used to generate the first magnetic field. In the example embodiment, each of the plurality of main wirings 31A extends in a direction parallel to the Y direction. The first end 30Aa is located forward of the plurality of main wirings 31A in the Y direction. The second end 30Ab is located forward of the plurality of main wirings 31A in the −Y direction. When a current is flowed through the first conductor layer 30A from the first end 30Aa to the second end 30Ab, a direction of the current flowing through each of the plurality of main wirings 31A is the −Y direction, and the first magnetic field including the magnetic field component in the −X direction, as the first magnetic field component, is generated. When a current is flowed through the first conductor layer 30A from the second end 30Ab to the first end 30Aa, a direction of the current flowing through each of the plurality of main wirings 31A is the Y direction, and the first magnetic field including the magnetic field component in the X direction, as the first magnetic field component, is generated.

As shown in FIG. 10, the second conductor layer 30B includes a first end 30Ba, a second end 30Bb, a plurality of main wirings 31B provided between the first end 30Ba and the second end 30Bb and separated from each other, a first sub-wiring 32B electrically connecting the first end 30Ba to the plurality of main wirings 31B, and a second sub-wiring 33B electrically connecting the second end 30Bb to the plurality of main wirings 31B. The first end 30Ba and the second end 30Bb are each connected to the processor 4 (see FIG. 3).

The area A20 in which the plurality of MR elements 50B constituting the resistor sections R21 to R24 of the second detection circuit 20 are arranged overlaps the plurality of main wirings 31B when seen in the Z direction. Also, the area A20 is located between the first sub-wiring 32B and the second sub-wiring 33B when seen in the Z direction. In other words, the plurality of MR elements 50B may be located between the first sub-wiring 32B and the second sub-wiring 33B when seen in the Z direction. In the area A20, the strength of the second magnetic field component is the same or substantially the same. Accordingly, the strength of the second magnetic field component applied to each of the plurality of MR elements 50B is the same or substantially the same.

The plurality of main wirings 31B are used to generate the second magnetic field. In the example embodiment, each of the plurality of main wirings 31B extends in a direction parallel to the X direction. The first end 30Ba is located forward of the plurality of main wirings 31A in the –X direction. The second end 30Bb is located forward of the plurality of main wirings 31A in the X direction. When a current is flowed through the second conductor layer 30B from the first end 30Ba to the second end 30Bb, a direction of the current flowing through each of the plurality of main wirings 31B is the X direction, and the second magnetic field including the magnetic field component in the –Y direction, as the second magnetic field component, is generated. When a current is flowed through the second conductor layer 30B from the second end 30Bb to the first end 30Ba, a direction of the current flowing through each of the plurality of main wirings 31B is the –X direction, and the second magnetic field including the magnetic field component in the Y direction, as the second magnetic field component, is generated.

Here, any conductor layer of the first and second conductor layers 30A and 30B is denoted by the reference sign 30. A first end of the conductor layer 30 corresponding to the first end 30Aa or the first end 30Ba is denoted by the reference sign 30*a*. A second end of the conductor layer 30 corresponding to the second end 30Ab or the second end 30Bb is denoted by the reference sign 30*b*. A plurality of main wirings of the conductor layer 30 corresponding to the plurality of main wirings 31A or the plurality of main wirings 31B are denoted by the reference sign 31. A first sub-wiring of the conductor layer 30 corresponding to the first sub-wiring 32A or the first sub-wiring 32B is denoted by the reference sign 32. A second sub-wiring of the conductor layer 30 corresponding to the second sub-wiring 33A or the second sub-wiring 33B is denoted by the reference sign 33.

Figure 11:
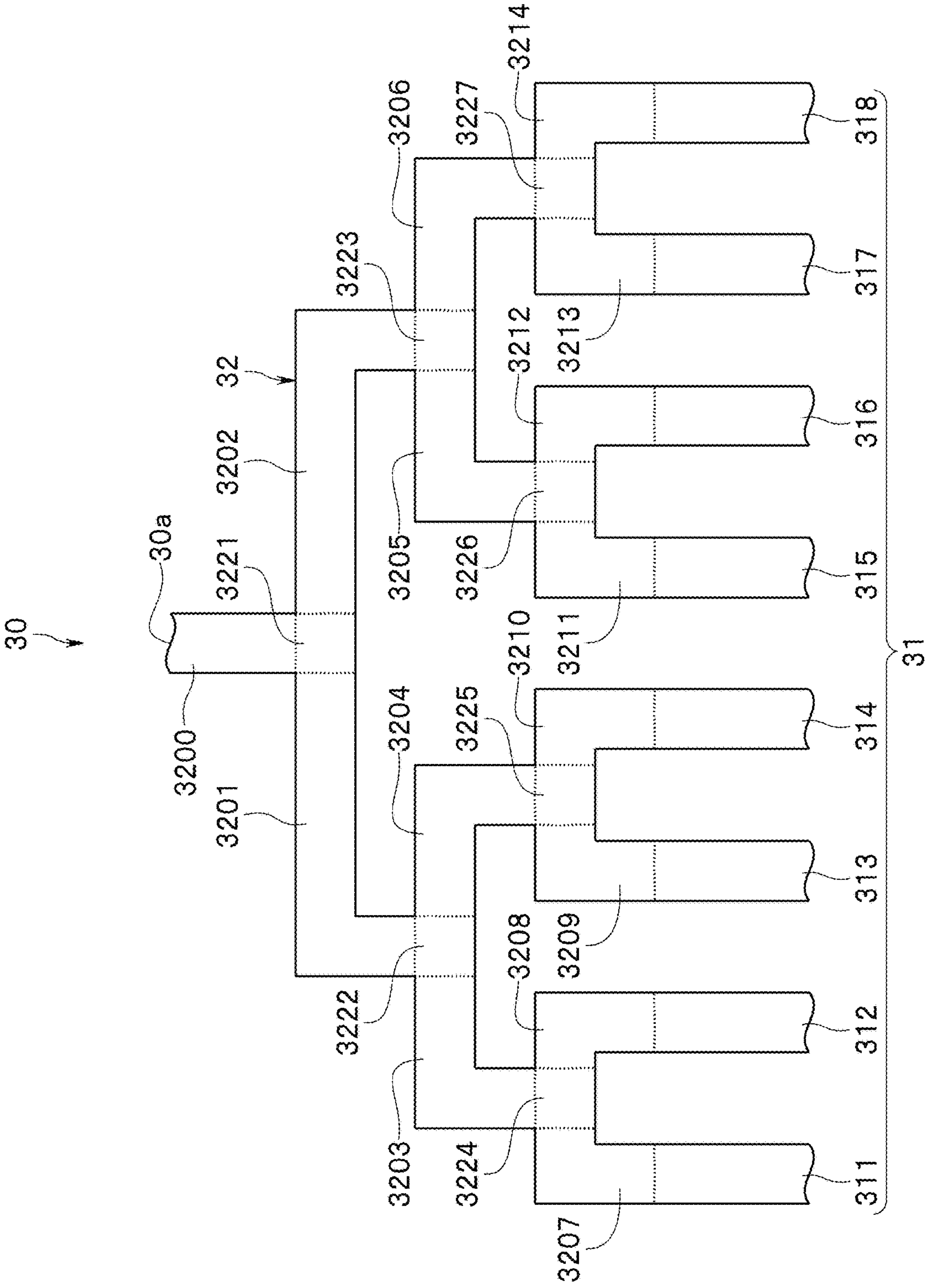
FIG. 11 is a plan view showing an enlarged part of a conductor layer in the first example embodiment of the technology.
Figure 12:
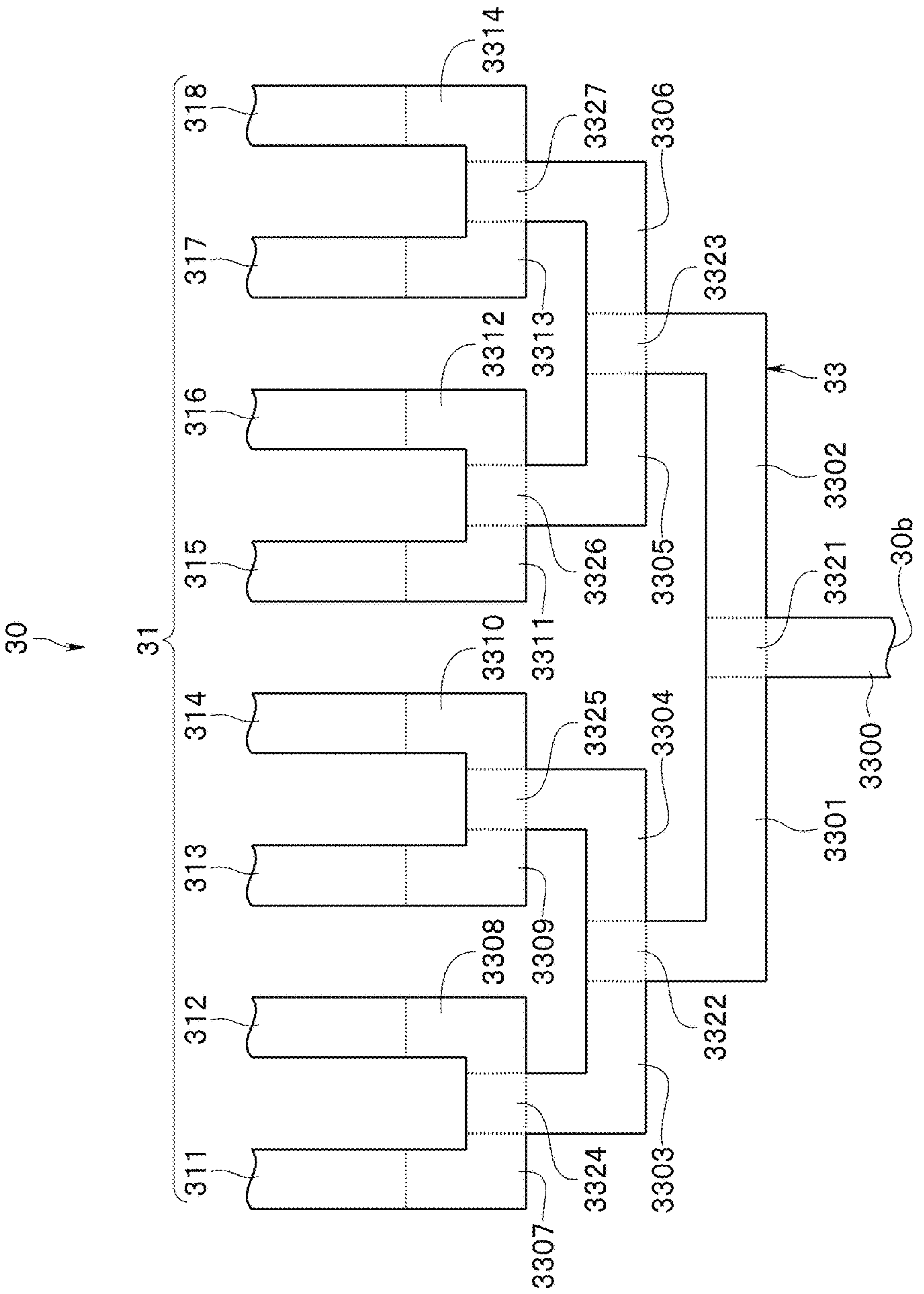
FIG. 12 is a plan view showing an enlarged other part of the conductor layer in the first example embodiment of the technology.

A configuration of the conductor layer 30 will be described in detail below with reference to FIG. 11 and FIG. 12. FIG. 11 is a plan view showing a part of the conductor layer 30. FIG. 12 is a plan view showing another part of the conductor layer 30. In the following description, an extending direction means an extending direction of each of the plurality of main wirings 31.

In the examples shown in FIG. 11 and FIG. 12, the conductor layer 30 includes eight main wirings 311, 312, 313, 314, 315, 316, 317, and 318 as the plurality of main wirings 31. The main wirings 311, 312, 313, 314, 315, 316, 317, and 318 are arranged in this order in a direction orthogonal to the extending direction. Any one of the main wirings 311 to 318 is referred to as a first main wiring, and two main wirings adjacent to both sides of the first main wiring are referred to as a second main wiring and a third main wiring. A distance between the first main wiring and the second main wiring and a distance between the first main wiring and the third main wiring may be the same.

First, features related to the first sub-wiring 32 will be described. The first sub-wiring 32 includes a plurality of first paths from the first end 30*a* to each of the plurality of main wirings 31. Each of the plurality of first paths passes through a plurality of first coupling portions from each of which the first sub-wiring 32 branches off. The number of the plurality of first coupling portions through which each of any two of the plurality of first paths passes is the same. In the example embodiment in particular, the number of the plurality of first coupling portions through which each of the all first paths passes may all be the same.

In the example shown in FIG. 11, the first sub-wiring 32 includes a plurality of wiring portions 3200, 3201, 3202, 3203, 3204, 3205, 3206, 3207, 3208, 3209, 3210, 3211, 3212, 3213, and 3214, and a plurality of first coupling portions 3221, 3222, 3223, 3224, 3225, 3226, and 3227. The first sub-wiring 32 is configured by electrically connecting the plurality of wiring portions 3200 to 3214 by the plurality of first coupling portions 3221 to 3227.

The wiring portions 3200, 3201, and 3202 are connected to the first coupling portion 3221. The wiring portions 3201, 3203, and 3204 are connected to the first coupling portion 3222. The wiring portions 3202, 3205, and 3206 are connected to the first coupling portion 3223. The wiring portions 3203, 3207, and 3208 are connected to the first coupling portion 3224. The wiring portions 3204, 3209, and 3210 are connected to the first coupling portion 3225. The wiring portions 3205, 3211, and 3212 are connected to the first coupling portion 3226. The wiring portions 3206, 3213, and 3214 are connected to the first coupling portion 3227.

The wiring portion 3200 is connected to the first end 30*a*. The wiring portion 3207 is connected to the main wiring 311. The wiring portion 3208 is connected to the main wiring 312. The wiring portion 3209 is connected to the main wiring 313. The wiring portion 3210 is connected to the main wiring 314. The wiring portion 3211 is connected to the main wiring 315. The wiring portion 3212 is connected to the main wiring 316. The wiring portion 3213 is connected to the main wiring 317. The wiring portion 3214 is connected to the main wiring 318.

In the example shown in FIG. 11, a path from the first end 30*a* to the main wiring 311 and a path from the first end 30*a* to the main wiring 312 pass through the first coupling portions 3221, 3222, and 3224. A path from the first end 30*a* to the main wiring 313 and a path from the first end 30*a* to the main wiring 314 pass through the first coupling portions 3221, 3222, and 3225. A path from the first end 30*a* to the main wiring 315 and a path from the first end 30*a* to the main wiring 316 pass through the first coupling portions 3221, 3223, and 3226. A path from the first end 30*a* to the main wiring 317 and a path from the first end 30*a* to the main wiring 318 pass through the first coupling portions 3221, 3223, and 3227.

Thus, in the example shown in FIG. 11, the number of the plurality of first coupling portions through which each of any two of the plurality of first paths passes is three. In the example shown in FIG. 11 in particular, the number of the plurality of first coupling portions through which each of the plurality of first paths passes is all three.

The plurality of first coupling portions 3221 to 3227 may include at least one specific coupling portion to which three of the plurality of wiring portions 3200 to 3214 are electrically connected. In the example embodiment in particular, the plurality of first coupling portions 3221 to 3227 are all the specific coupling portions described above.

Here, in each of the plurality of first paths, the focus is placed on two first coupling portions connected via one wiring portion. A distance between the two first coupling portions in the extending direction may be greater than or equal to the width of the above one wiring portion multiplied by the square root of 2.

Next, the features related to the second sub-wiring 33 will be described. The number of the plurality of second coupling portions through which each of any two of the plurality of second paths passes is the same. In the example embodiment in particular, the number of the plurality of second coupling portions through which each of the plurality of second paths passes may be all the same.

In the example shown in FIG. 12, the second sub-wiring 33 includes a plurality of wiring portions 3300, 3301, 3302, 3303, 3304, 3305, 3306, 3307, 3308, 3309, 3310, 3311, 3312, 3313, and 3314, and a plurality of second coupling portions 3321, 3322, 3323, 3324, 3325, 3326, and 3327. The second sub-wiring 33 is configured by electrically connecting the plurality of wiring portions 3300 to 3314 by the plurality of second coupling portions 3321 to 3327.

The wiring portions 3300, 3301, and 3302 are connected to the second coupling portion 3321. The wiring portions 3301, 3303, and 3304 are connected to the second coupling portion 3322. The wiring portions 3302, 3305, and 3306 are connected to the second coupling portion 3323. The wiring portions 3303, 3307, and 3308 are connected to the second coupling portion 3324. The wiring portions 3304, 3309, and 3310 are connected to the second coupling portion 3325. The wiring portions 3305, 3311, and 3312 are connected to the second coupling portion 3326. The wiring portions 3306, 3313, and 3314 are connected to the second coupling portion 3327.

The wiring portion 3300 is connected to the second end 30*b*. The wiring portion 3307 is connected to the main wiring 311. The wiring portion 3308 is connected to the main wiring 312. The wiring portion 3309 is connected to the main wiring 313. The wiring portion 3310 is connected to the main wiring 314. The wiring portion 3311 is connected to the main wiring 315. The wiring portion 3312 is connected to the main wiring 316. The wiring portion 3313 is connected to the main wiring 317. The wiring portion 3314 is connected to the main wiring 318.

In the example shown in FIG. 12, a path from the second end 30*b* to the main wiring 311 and a path from the second end 30*b* to the main wiring 312 pass through the second coupling portions 3321, 3322, and 3324. A path from the second end 30*b* to the main wiring 313 and a path from the second end 30*b* to the main wiring 314 pass through the second coupling portions 3321, 3322, and 3325. A path from the second end 30*b* to the main wiring 315 and a path from the second end 30*b* to the main wiring 316 pass through the second coupling portions 3321, 3323, and 3326. A path from the second end 30*b* to the main wiring 317 and a path from the second end 30*b* to the main wiring 318 pass through the second coupling portions 3321, 3323, and 3327.

Thus, in the example shown in FIG. 12, the number of the plurality of second coupling portions through which each of any two of the plurality of second paths passes is three. In the example shown in FIG. 12 in particular, the number of the plurality of second coupling portions through which each of the plurality of second paths passes is all three.

The plurality of second coupling portions 3321 to 3327 may include at least one specific coupling portion to which three of the plurality of wiring portions 3300 to 3314 are electrically connected. In the example embodiment in particular, the plurality of second coupling portions 3321 to 3327 may all be the specific coupling portions described above.

Here, in each of the plurality of second paths, the focus is placed on two second coupling portions connected via one wiring portion. A distance between the two second coupling portions in the extending direction may be greater than or equal to the width of the above one wiring portion multiplied by the square root of 2.

Next, the number of the plurality of first coupling portions and the number of the plurality of second coupling portions will be described. Here, the number of the plurality of main wirings 31 is n. A sum of the number of the plurality of first coupling portions and the number of the plurality of second coupling portions may be 2 (n−1). In the examples shown in FIG. 11 and FIG. 12, the number of the main wirings 311 to 318 is eight, and the sum of the number of the plurality of first coupling portions 3221 to 3227 and the number of the plurality of second coupling portions 3321 to 3327 is fourteen.

Next, a shape of the conductor layer 30 will be described. The conductor layer 30 may have a symmetrical shape about an imaginary plane intersecting the first end 30*a* and the second end 30*b*. In the example shown in FIG. 11, the plurality of main wirings 31 have a symmetrical shape about the above imaginary plane, and each of the first sub-wiring 32 and the second sub-wiring 33 has a symmetrical shape about the above imaginary plane.

A cross-sectional shape of each of the plurality of main wirings 31 may be rectangular. A cross-sectional shape of each of the plurality of wiring portions of the first sub-wiring 32 may be rectangular. A cross-sectional shape of each of the plurality of wiring portions of the second sub-wiring 33 may be rectangular.

Next, the operation and effects of the magnetic sensor device 1 according to the example embodiment will be described. In the magnetic sensor device 1 according to the example embodiment, the number of the plurality of first coupling portions through which each of any two of the plurality of first paths passes is the same. According to the example embodiment, this allows the current density in any two of the first paths to be more uniform than if the number of the plurality of first coupling portions through which each of any two of the first paths passes is different. Similarly, in the example embodiment, the number of the plurality of second coupling portions through which each of any two of the plurality of second paths passes is the same. According to the example embodiment, this allows the current density in any two of the second paths to be more uniform than if the number of the plurality of second coupling portions through which each of any two of the second paths passes is different.

According to the example embodiment, by connecting one of the above two first paths and one of the above two second paths to the same main wiring 31, and connecting the other of the above two first paths and the other of the above two second paths to the same other main wiring, the current density in each of the two main wirings 31 can be made uniform.

In the example embodiment in particular, the number of the plurality of first coupling portions through which each of the plurality of first paths passes may all be the same, and the number of the plurality of second coupling portions through which each of the plurality of second paths passes may all be the same. According to the example embodiment, this allows the current density in each of the plurality of main wirings 31 to be made uniform. Thus, according to the example embodiment, the strength of the magnetic field generated from each of the plurality of main wirings 31 can be made uniform. As a result, according to the example embodiment, the strength of the first magnetic field component applied to the plurality of MR elements 50A constituting the resistor sections R11 to R14 of the first detection circuit 10 of the magnetic sensor 2 can be made uniform, and the strength of the second magnetic field component applied to the plurality of MR elements 50B constituting the resistor sections R21 to R24 of the second detection circuit 20 of the magnetic sensor 2 can be made uniform.

In the example embodiment, each of the plurality of main wirings 31 has a long shape in one direction and includes one end closest to the first end 30*a* and another end closest to the second end 30*b*. According to the example embodiment, by making the number of the plurality of first coupling portions through which each of the plurality of first paths passes the same and making the number of the second coupling portions through which each of the plurality of second paths passes the same, the length of each of the plurality of first paths can be all the same and the length of each of the plurality of second paths can be all the same. According to the example embodiment, this allows the potential difference between the one end and the other end of each of the plurality of main wirings 31 to be the same. According to the example embodiment, this also allows the strength of the first magnetic field component to be made uniform and the strength of the second magnetic field component to be made uniform.

According to the example embodiment, by making the length of each of the plurality of main wirings 31 all the same, making the length of each of the plurality of first paths all the same, and the length of each of the plurality of second paths all the same, the length of each of the plurality of paths from the first end 30*a* to the second end 30*b* through the first sub-wiring 32, the plurality of main wirings 31, and the second sub-wiring 33 can all be the same. According to the example embodiment, this also allows the strength of the first magnetic field component to be made uniform and the strength of the second magnetic field component to be made uniform.

According to the example embodiment, by making the cross-sectional area of each of the plurality of main wirings 31 all the same, the cross-sectional area of each of the plurality of wiring portions 3200 to 3214 of the first sub-wiring 32 all the same, and the cross-sectional area of each of the plurality of wiring portions 3300 to 3314 of the second sub-wiring 33 all the same, and by making the length of each of the plurality of paths all the same, the resistance of each of the above plurality of paths can be made all the same. According to the example embodiment, this also allows the strength of the first magnetic field component to be made uniform and the strength of the second magnetic field component to be made uniform.

Modification

Figure 13:
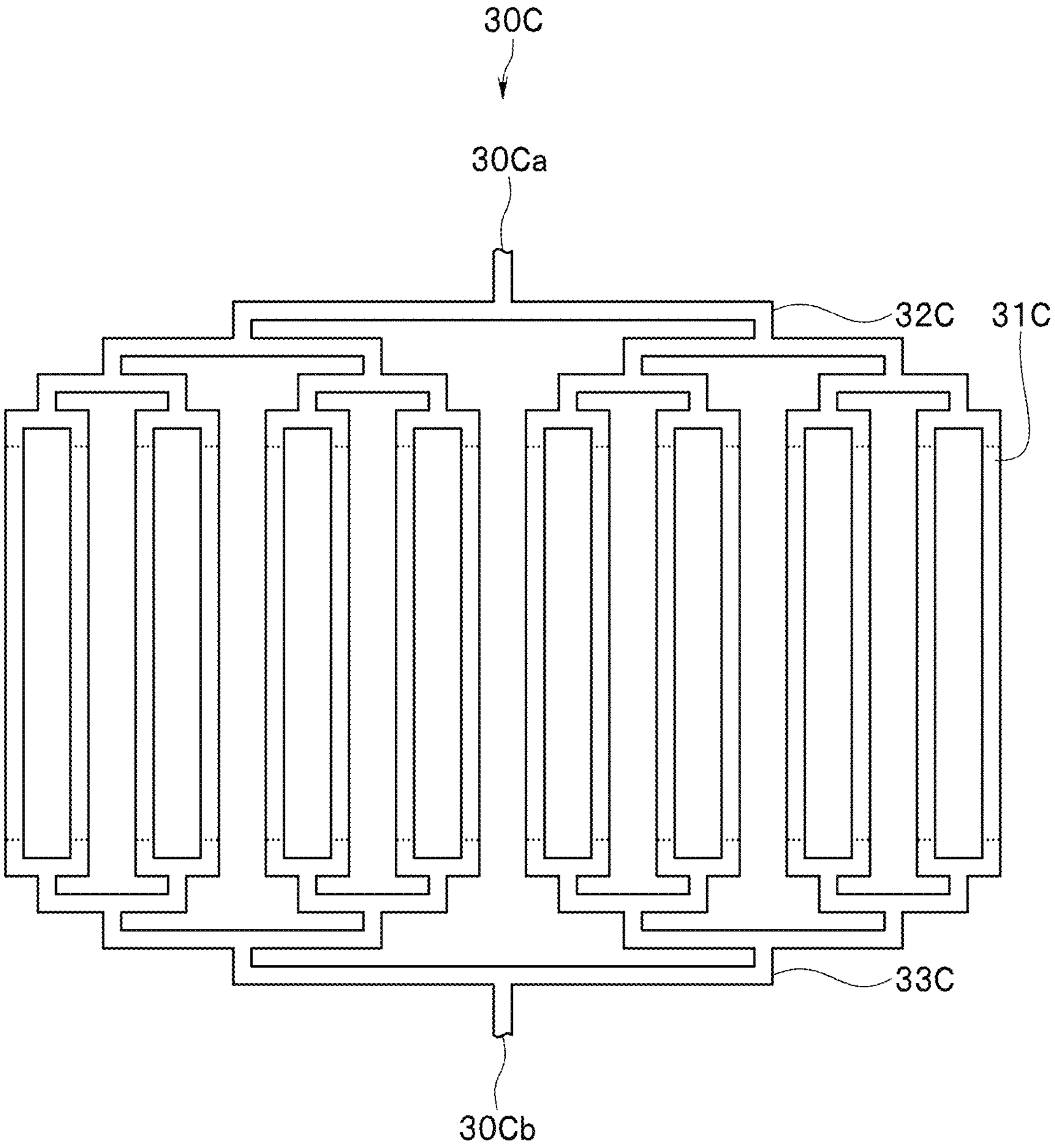
FIG. 13 is a plan view showing a conductor layer of a first modification in the first example embodiment of the technology.

Next, modifications of the conductor layer 30 of the magnetic field generator 3 in the example embodiment will be described. First, a conductor layer of a first modification will be described with reference to FIG. 13. FIG. 13 is a plan view showing a conductor layer 30C of the first modification. The conductor layer 30C includes a first end 30Ca, a second end 30Cb, a plurality of main wirings 31C provided between the first end 30Ca and the second end 30Cb and separated from each other, a first sub-wiring 32C electrically connecting the first end 30Ca to the plurality of main wirings 31C, and a second sub-wiring 33C electrically connecting the second end 30Cb to the plurality of main wirings 31C.

The first sub-wiring 32C includes a plurality of first paths from the first end 30Ca to each of the plurality of main wirings 31C. Each of the plurality of first paths passes through a plurality of first coupling portions from each of which the first sub-wiring 32C branches off. The number of the plurality of first coupling portions through which each of the plurality of first paths passes is all four.

The second sub-wiring 33C includes a plurality of second paths from the second end 30Cb to each of the plurality of main wirings 31C. Each of the plurality of second paths passes through a plurality of second coupling portions from each of which the second sub-wiring 33C branches off. The number of the plurality of second coupling portions through which each of the plurality of second paths passes is all four.

In the conductor layer 30C of the first modification, the number of the plurality of main wirings 31C is sixteen, and a sum of the number of the plurality of first coupling portions and the number of the plurality of second coupling portions is thirty.

Figure 14:
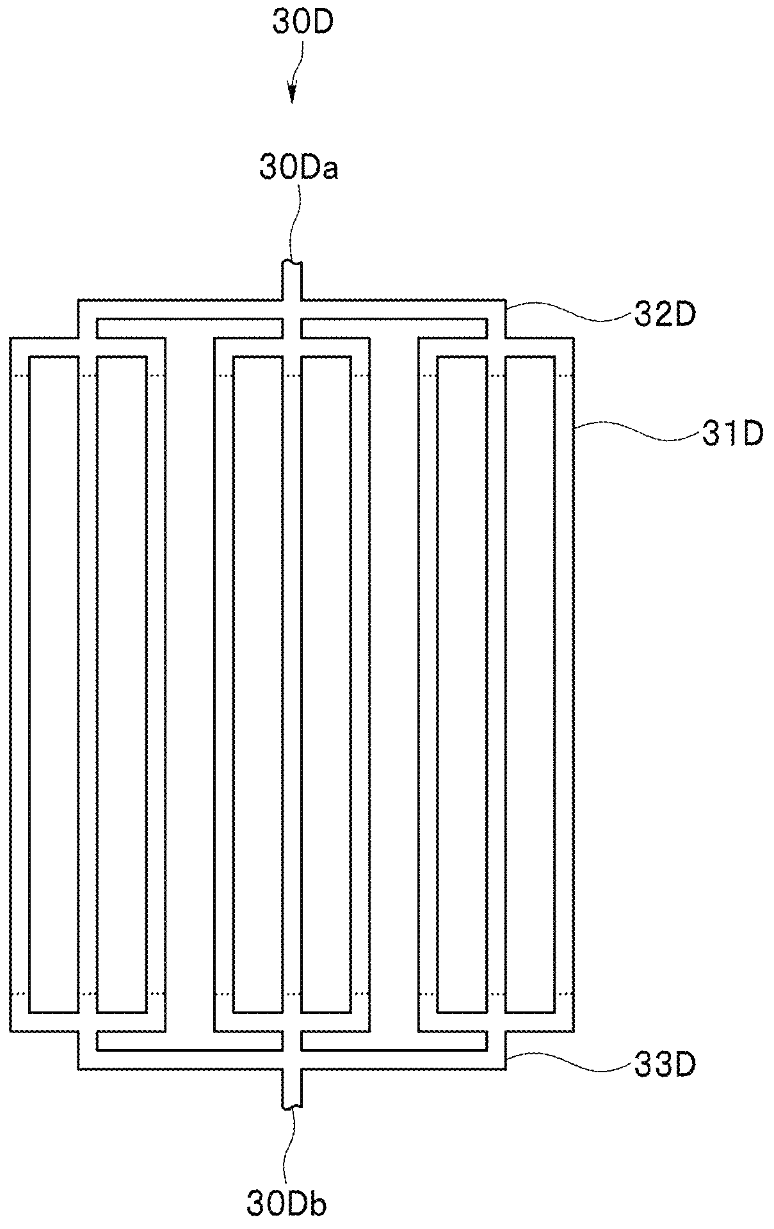
FIG. 14 is a plan view showing a conductor layer of a second modification in the first example embodiment of the technology.

Next, a conductor layer of a second modification will be described with reference to FIG. 14. FIG. 14 is a plan view showing a conductor layer 30D of the second modification. The conductor layer 30D includes a first end 30Da, a second end 30Db, a plurality of main wirings 31D provided between the first end 30Da and the second end 30Db and separated from each other, a first sub-wiring 32D electrically connecting the first end 30Da to the plurality of main wirings 31D, and a second sub-wiring 33D electrically connecting the second end 30Db to the plurality of main wirings 31D.

The first sub-wiring 32D includes a plurality of first paths from the first end 30Da to each of the plurality of main wirings 31D. Each of the plurality of first paths passes through a plurality of first coupling portions from each of which the first sub-wiring 32D branches off. The number of the plurality of first coupling portions through which each of the plurality of first paths passes is all two. The plurality of first paths include four first paths each having a first length, two first paths each having a second length shorter than the first length, two first paths each having a third length shorter than the second length, and one first path having a fourth length shorter than the third length.

The second sub-wiring 33D includes a plurality of second paths from the second end 30Db to each of the plurality of main wirings 31D. Each of the plurality of second paths passes through a plurality of second coupling portions from each of which the second sub-wiring 33D branches off. The number of the plurality of second coupling portions through which each of the plurality of second paths passes is all two. The plurality of second paths include four second paths each having a fifth length, two second paths each having a sixth length shorter than the fifth length, two second paths each having a seventh length shorter than the sixth length, and one second path having an eighth length shorter than the seventh length.

In the conductor layer 30D of the second modification, the number of the plurality of main wirings 31D is nine, and a sum of the number of the plurality of first coupling portions and the number of the plurality of the second coupling portions is eight.

Figure 15:
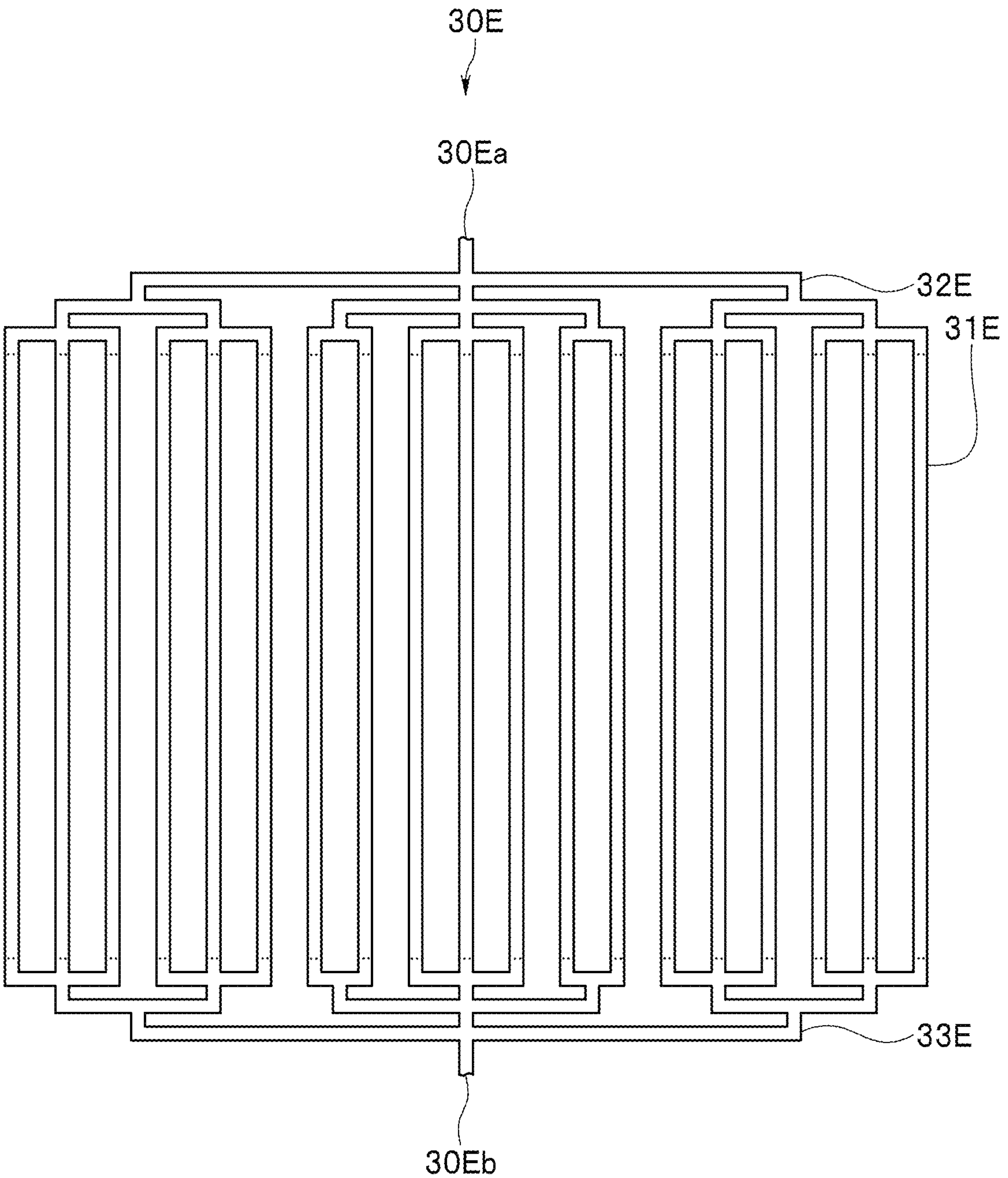
FIG. 15 is a plan view showing a conductor layer of a third modification in the first example embodiment of the technology.

Next, a conductor layer of a third modification will be described with reference to FIG. 15. FIG. 15 is a plan view showing a conductor layer 30E of the third modification. The conductor layer 30E includes a first end 30Ea, a second end 30Eb, a plurality of main wirings 31E provided between the first end 30Ea and the second end 30Eb and separated from each other, a first sub-wiring 32E electrically connecting the first end 30Ea to the plurality of main wirings 31E, and a second sub-wiring 33E electrically connecting the second end 30Eb to the plurality of main wirings 31E.

The first sub-wiring 32E includes a plurality of first paths from the first end 30Ea to each of the plurality of main wirings 31E. Each of the plurality of first paths passes through a plurality of first coupling portions from each of which the first sub-wiring 32E branches off. The number of the plurality of first coupling portions through which each of the plurality of first paths passes is all three. The plurality of first paths includes eight first paths each having a first length, four first paths each having a second length shorter than the first length, four first paths each having a third length shorter than the second length, two first paths each having a fourth length shorter than the third length, and one first path having a fifth length shorter than the fourth length.

The second sub-wiring 33E includes a plurality of second paths from the second end 30Eb to each of the plurality of main wirings 31E. Each of the plurality of second paths passes through a plurality of second coupling portions from each of which the second sub-wiring 33E branches off. The number of the plurality of second coupling portions through which each of the plurality of second paths passes is all three. The plurality of second paths include eight second paths each having a sixth length, four second paths each having a seventh length shorter than the sixth length, four second paths each having an eighth length shorter than the seventh length, two second paths each having a ninth length shorter than the eighth length, and one second path having a tenth length shorter than the ninth length.

In the conductor layer 30E of the second modification, the number of the plurality of main wirings 31E is nineteen, and a sum of the number of the plurality of first coupling portions and the number of the plurality of second coupling portions is twenty-two.

Second Example Embodiment

Next, a second example embodiment of the technology will be described. First, a brief description will be given of the points in which a configuration of a magnetic sensor device 1 according to the example embodiment differs from that of the first example embodiment. In the example embodiment, a magnetic sensor 2 and a magnetic field generator 3 are configured to be integrated into a single electronic component, and a processor 4 is configured to be an electronic component separate from the magnetic sensor 2 and the magnetic field generator 3. The electronic component that includes the magnetic sensor 2 and the magnetic field generator 3 is hereinafter referred to as an electronic component 105. The electronic component 105 is in a form of a rectangular parallelepiped chip, similar to the first electronic component 5 or the second electronic component 6 in the first example embodiment.

Figure 16:
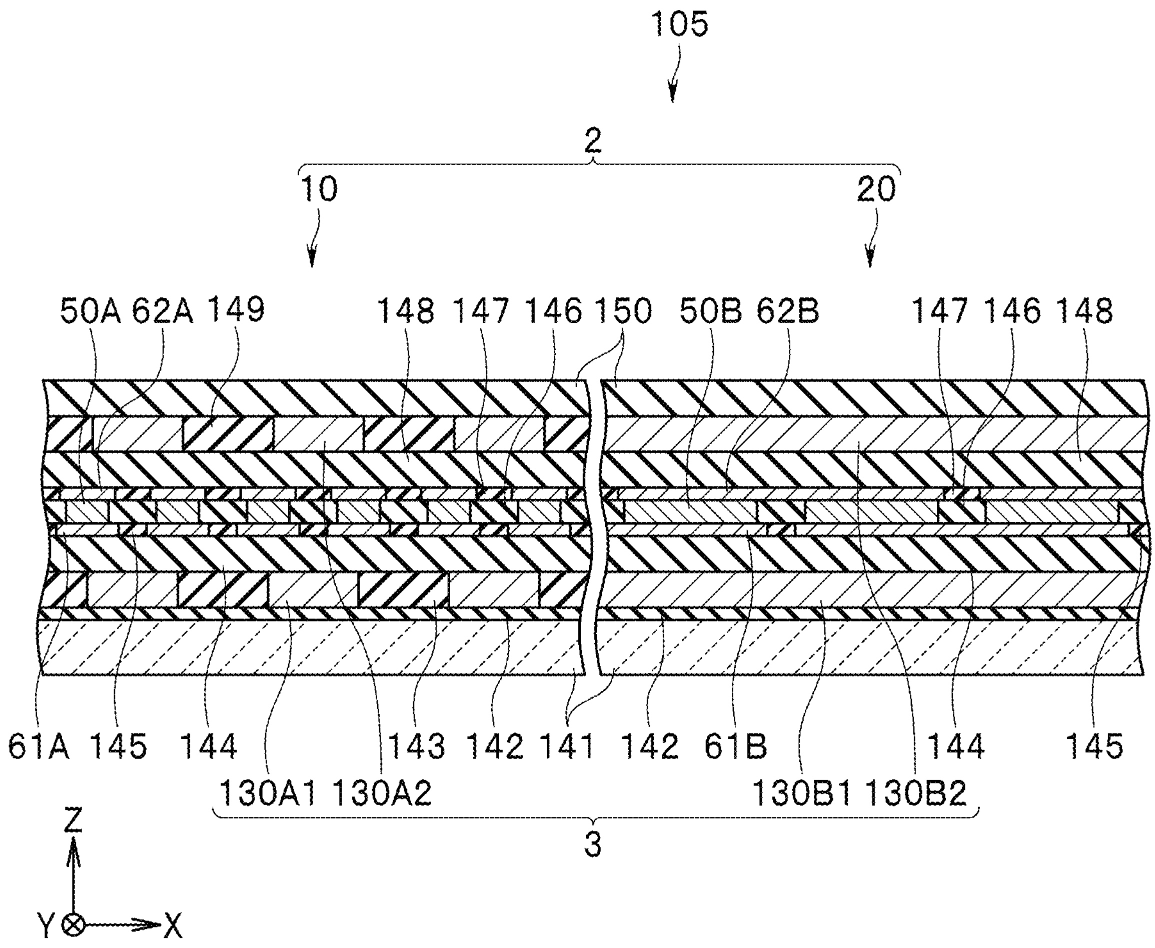
FIG. 16 is a cross-sectional view showing an electronic component in a second example embodiment of the technology.

Next, a structure of the electronic component 105 will be described with reference to FIG. 16. FIG. 16 is a cross-sectional view showing the electronic component 105.

The magnetic field generator 3 includes two first conductor layers 130A1 and 130A2, each made of a conductive material, instead of the first conductor layer 30A in the first example embodiment. A shape of each of the first conductor layers 130A1 and 130A2 is similar to that of the first conductor layer 30A. The first conductor layers 130A1 and 130A2 are configured to generate a first magnetic field including a first magnetic field component to be applied to the first detection circuit 10 of the magnetic sensor 2. The first conductor layers 130A1 and 130A2 are connected in series or parallel.

The magnetic field generator 3 also includes two second conductor layers 130B1 and 130B2, each made of a conductive material, instead of the second conductor layer 30B in the first example embodiment. A shape of each of the second conductor layers 130B1 and 130B2 is similar to that of the second conductor layer 30B. The second conductor layers 130B1 and 130B2 are configured to generate a second magnetic field including a second magnetic field component to be applied to the second detection circuit 20 of the magnetic sensor 2. The second conductor layers 130B1 and 130B2 are connected in series or parallel.

The electronic component 105 further includes a substrate 141 and insulating layers 142, 143, 144, 145, 146, 147, 148, 149, and 150. The insulating layer 142 is disposed on the substrate 141. The first conductor layer 130A1 and the second conductor layer 130B1 are disposed on the insulating layer 142. The insulating layer 143 is disposed around the first conductor layer 130A1 and around the second conductor layer 130B1 on the insulating layer 142. The insulating layer 144 is disposed on the first conductor layer 130A1, the second conductor layer 130B1, and the insulating layer 143.

As described in the first example embodiment, the first detection circuit 10 of the magnetic sensor 2 includes the plurality of MR elements 50A, the plurality of lower electrodes 61A, and the plurality of upper electrodes 62A. The second detection circuit 20 of the magnetic sensor 2 includes the plurality of MR elements 50B, the plurality of lower electrodes 61B, and the plurality of upper electrodes 62B. The plurality of lower electrodes 61A and the plurality of lower electrodes 61B are disposed on the insulating layer 144. The insulating layer 145 is disposed around the plurality of lower electrodes 61A and around the plurality of lower electrodes 61B on the insulating layer 144. The plurality of MR elements 50A are disposed on the plurality of lower electrodes 61A. The plurality of MR elements 50B are disposed on the plurality of lower electrodes 61B. The insulating layer 146 is disposed around the plurality of MR elements 50A and around the plurality of MR elements 50B on the plurality of lower electrodes 61A, the plurality of lower electrodes 61B, and the insulating layer 145.

The plurality of upper electrodes 62A are disposed on the plurality of MR elements 50A and the insulating layer 146. The plurality of upper electrodes 62B are disposed on the plurality of MR elements 50B and the insulating layer 146. The insulating layer 147 is disposed around the plurality of upper electrodes 62A and around the plurality of upper electrodes 62B on the insulating layer 146.

The insulating layer 148 is disposed on the plurality of upper electrodes 62A, the plurality of upper electrodes 62B, and the insulating layer 147. The first conductor layers 130A2 and the second conductor layer 130B2 are disposed on the insulating layer 148. The insulating layer 149 is disposed around the first conductor layer 130A2 and around the second conductor layer 130B2 on the insulating layer 148. The insulating layer 150 is disposed on the first conductor layer 130A2, the second conductor layer 130B2, and the insulating layer 149.

In the example embodiment, the plurality of MR elements 50A of the first detection circuit 10 may be located between the first conductor layer 130A1 and the first conductor layer 130A2. The magnetic field generator 3 may include only one of the first conductor layer 130A1 and the first conductor layer 130A2.

In the example embodiment, the plurality of MR elements 50B of the second detection circuit 20 may be located between the second conductor layer 130B1 and the second conductor layer 130B2. The magnetic field generator 3 may include only one of the second conductor layers 130B1 and 130B2.

Other configurations, operation, and effects in the example embodiment are the same as in the first example embodiment.

Third Example Embodiment

Next, a third example embodiment of the technology will be described. First, a brief description will be given of the points in which a configuration of a magnetic sensor device 1 according to the example embodiment differs from that of the first example embodiment. The magnetic sensor device 1 according to the example embodiment includes a magnetic sensor 202 instead of the magnetic sensor 2 in the first example embodiment. The first electronic component 5 (see FIG. 2) includes the magnetic sensor 202. The magnetic sensor 202 includes a first detection circuit 210 and a second detection circuit 220.

The first detection circuit 210 includes the plurality of MR elements 50A, the plurality of lower electrodes 61A, and the plurality of upper electrodes 62A, similar to the first detection circuit 10 in the first example embodiment. The second detection circuit 220 includes the plurality of MR elements 50B, the plurality of lower electrodes 61B, and the plurality of upper electrodes 62B, similar to the second detection circuit 20 in the first example embodiment.

The magnetic sensor device 1 according to the example embodiment detects a geomagnetic field as a target magnetic field. The first detection circuit 210 detects a component of the geomagnetic field in a first direction and generates at least one first detection signal having a correspondence with the component. The second detection circuit 220 detects a component of the geomagnetic field in a second direction and generates at least one second detection signal having a correspondence with the component. In the example embodiment in particular, the first direction is a direction parallel to the X direction and the second direction is a direction parallel to the Y direction.

The first and second detection circuits 210 and 220 are connected to the processor 4 (see FIG. 3). The processor 4 is configured to generate, based on the at least one first detection signal and the at least one second detection signal, a detection value having a correspondence with the strength of the component of the geomagnetic field in the first direction and a detection value having a correspondence with the strength of the component of the geomagnetic field in the second direction.

Figure 17:
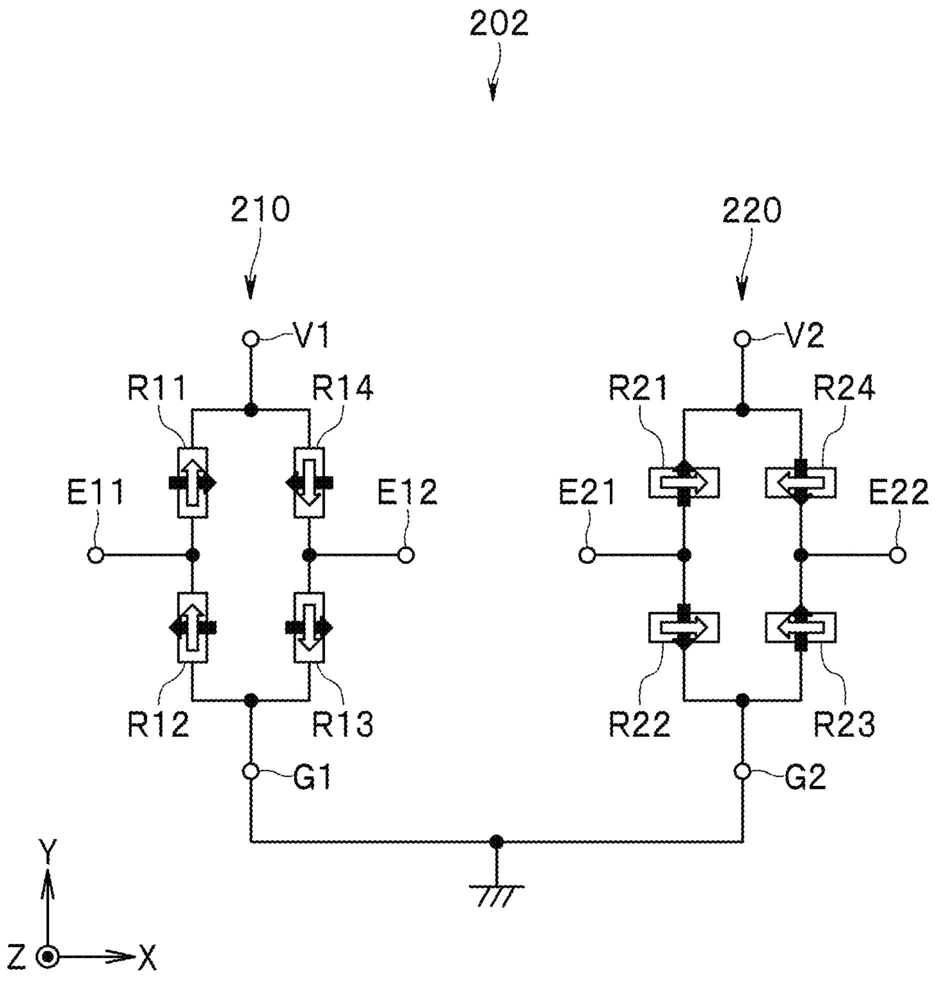
FIG. 17 is a circuit diagram showing a circuit configuration of a magnetic sensor in a third example embodiment of the technology.

Next, a circuit configuration of the magnetic sensor 202 will be described with reference to FIG. 17. FIG. 17 is a circuit diagram showing the circuit configuration of the magnetic sensor 202.

A configuration of the first detection circuit 210 is basically the same as the configuration of the first detection circuit 10 shown in FIG. 4 in the first example embodiment. The first detection circuit 210 includes four resistor sections R11, R12, R13, and R14. Each of the resistor sections R11 to R14 includes a plurality of MR elements 50A.

A configuration of the second detection circuit 220 is basically the same as the configuration of the second detection circuit 20 shown in FIG. 4 in the first example embodiment. The second detection circuit 220 includes four resistor sections R21, R22, R23, and R24. Each of the resistor sections R21 to R24 includes a plurality of MR elements 50B.

As described in the first example embodiment, each of the plurality of MR elements 50A and the plurality of MR elements 50B includes the magnetization pinned layer 52 and the free layer 54 (see FIG. 6). In FIG. 17, the filled arrows represent the magnetization direction of the magnetization pinned layer 52 in each of the resistor sections R11 to R14 and R21 to R24. The magnetization direction of the magnetization pinned layer 52 in each of the resistor sections R11 to R14 and R21 to R24 is the same direction as shown in FIG. 4 in the first example embodiment.

In FIG. 17, the hollow arrows represent the magnetization direction of the free layer 54 when the target magnetic field (external magnetic field) is not applied to the first and second detection circuits 210 and 220. The free layer 54 in each of the resistor sections R11 to R14 has a shape anisotropy in which the direction of the magnetization easy axis is a direction parallel to the Y direction. In the example shown in FIG. 17, the magnetization direction of the free layer 54 in each of the resistor sections R11 and R12 is the Y direction when the target magnetic field (external magnetic field) is not applied to the first detection circuit 210. The magnetization direction of the free layer 54 in each of the resistor sections R13 and R14 is the −Y direction in the above case.

The direction of the magnetization easy axis of the free layer 54 in each of the resistor sections R21 to R24 has a shape anisotropy in which the direction of the magnetization easy axis is a direction parallel to the X direction. In the example shown in FIG. 17, the magnetization direction of the free layer 54 in each of the resistor sections R21 and R22 is the X direction when the target magnetic field (external magnetic field) is not applied to the second detection circuit 220. The magnetization direction of the free layer 54 in each of the resistor sections R23 and R24 is the −X direction in the above case.

Next, the configuration of the magnetic field generator 3 in the example embodiment will be described. In the example embodiment, the magnetic field generator 3 includes a first conductor layer 230A and a second conductor layer 230B, each made of a conductive material, instead of the first and second conductor layers 30A and 30B in the first example embodiment.

First, a configuration of the first conductor layer 230A will be described. The first conductor layer 230A is configured to generate a first magnetic field including a first magnetic field component to be applied to a part of each of the first and second detection circuits 210 and 220.

The first conductor layer 230A has the same structure as the first conductor layer 30A in the first example embodiment. That is, the first conductor layer 230A includes a first end, a second end, a plurality of main wirings 231A provided between the first end and the second end and separated from each other, a first sub-wiring electrically connecting the first end to the plurality of main wirings 231A, and a second sub-wiring electrically connecting the second end to the plurality of main wirings 231A. The first end and the second end are each connected to the processor 4 (see FIG. 3).

Figure 18:
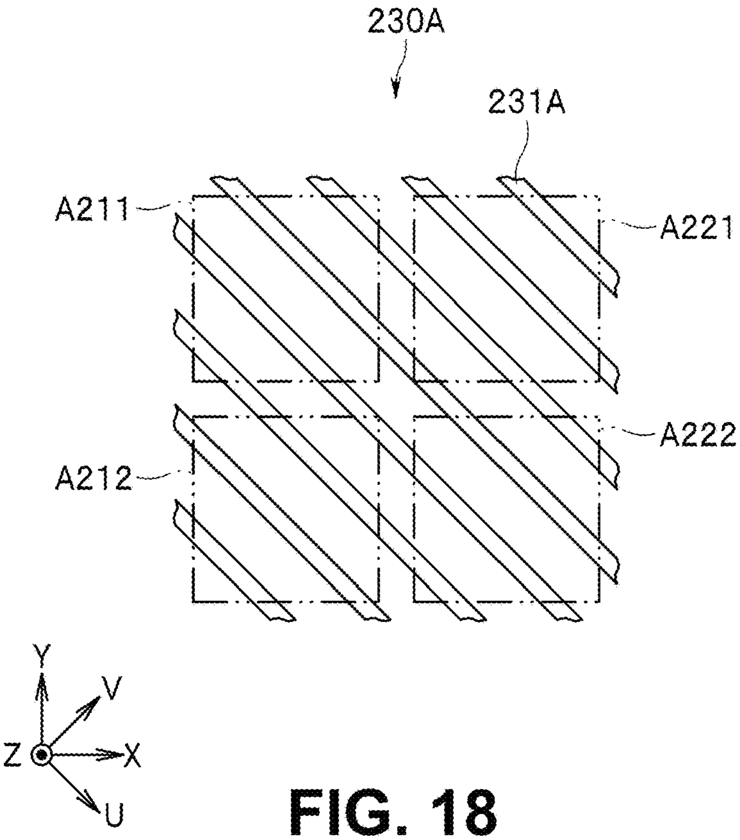
FIG. 18 is a plan view showing a part of a first conductor layer in the third example embodiment of the technology.

The first conductor layer 230A is arranged to overlap a part of each of the first and second detection circuits 210 and 220 when seen in the Z direction. The arrangement of the first conductor layer 230A will be described below with reference to FIG. 18. FIG. 18 is a plan view showing a part of the first conductor layer 230A.

In FIG. 18, a rectangular area denoted by the reference sign A211 indicates an area where the plurality of MR elements 50A constituting the resistor section R11 of the first detection circuit 210 are arranged. A rectangular area denoted by the reference sign A212 indicates an area where the plurality of MR elements 50A constituting the resistor section R12 of the first detection circuit 210 are arranged. A rectangular area denoted by the reference sign A221 indicates an area where the plurality of MR elements 50B constituting the resistor section R21 of the second detection circuit 220 are arranged. A rectangular area denoted by the reference sign A222 indicates an area where the plurality of MR elements 50B constituting the resistor section R22 of the second detection circuit 220 are arranged.

As shown in FIG. 18, the area A221 is located forward of the area A211 in the X direction. The areas A212 and A222 are located forward of the areas A211 and A221 in the −Y direction, respectively. The areas A211, A212, A221, and A222 overlap the plurality of main wirings 231A when seen in the Z direction. The areas A211, A212, A221, and A222 are located between the first sub-wiring and the second sub-wiring when seen in the Z direction. The arrangement of the areas A211, A212, A221, and A222 is not limited to the example shown in FIG. 18.

Here, as shown in FIG. 18, a U direction and a V direction are defined as follows. The U direction is a direction rotated from the X direction toward the −Y direction. The V direction is a direction rotated from the Y direction toward the X direction. In the example embodiment in particular, the U direction is a direction rotated from the X direction toward the −Y direction by $\alpha$, and the V direction is a direction rotated from the Y direction toward the X direction by $\alpha$. Note that $\alpha$ is an angle greater than 0° and less than 90°. In one example, $\alpha$ is 45°. A direction opposite to the U direction is a −U direction, and a direction opposite to the V direction is a −V direction.

The plurality of main wirings 231A are used to generate a first magnetic field. In the example shown in FIG. 18, each of the plurality of main wirings 231A extends in a direction parallel to the U direction. A first end is located forward of the plurality of main wirings 231A in the U direction. A second end is located forward of the plurality of main wirings 231A in the −U direction. When a current is flowed through the first conductor layer 230A from the first end to the second end, a direction of the current flowing through each of the plurality of main wirings 231A is the −U direction, and the first magnetic field including a magnetic field component in the V direction, as the first magnetic field component, is generated.

Next, a configuration of the second conductor layer 230B will be described. The second conductor layer 230B is configured to generate a second magnetic field including a second magnetic field component to be applied to another part of each of the first and second detection circuits 210 and 220.

The second conductor layer 230B has the same structure as the second conductor layer 30B in the first example embodiment. That is, the second conductor layer 230B includes a first end, a second end, a plurality of main wirings 231B provided between the first end and the second end and separated from each other, a first sub-wiring electrically connecting the first end to the plurality of main wirings 231B, and a second sub-wiring electrically connecting the second end to the plurality of main wirings 231B. The first end and the second end are each connected to the processor 4 (see FIG. 3).

Figure 19:
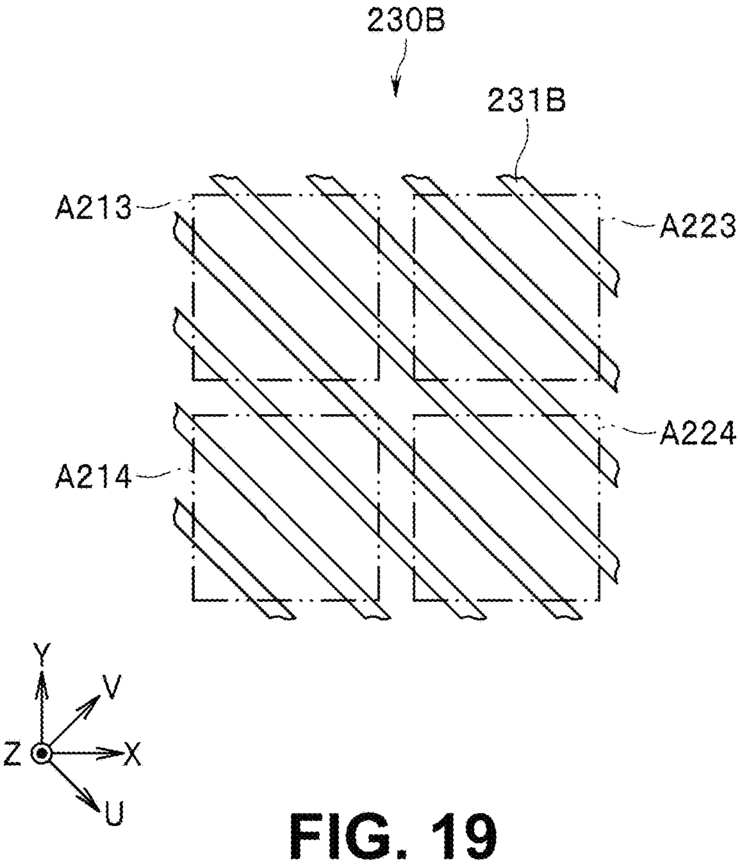
FIG. 19 is a plan view showing a part of a second conductor layer in the third example embodiment of the technology.

The second conductor layer 230B is arranged to overlap a part of each of the first and second detection circuits 210 and 220 when seen in the Z direction. The arrangement of the second conductor layer 230B will be described below with reference to FIG. 19. FIG. 19 is a plan view showing a part of the second conductor layer 230B.

In FIG. 19, a rectangular area denoted by the reference sign A213 indicates an area where the plurality of MR elements 50A constituting the resistor section R13 of the first detection circuit 210 are arranged. A rectangular area denoted by the reference sign A214 indicates an area where the plurality of MR elements 50A constituting the resistor section R14 of the first detection circuit 210 are arranged. A rectangular area denoted by the reference sign A223 indicates an area where the plurality of MR elements 50B constituting the resistor section R23 of the second detection circuit 220 are arranged. A rectangular area denoted by the reference sign A224 indicates an area where the plurality of MR elements 50B constituting the resistor section R24 of the second detection circuit 220 are arranged.

As shown in FIG. 19, the area A223 is located forward of the area A213 in the X direction. The areas A214 and A224 are located forward of the areas A213 and A223 in the −Y direction, respectively. The areas A213, A214, A223, and A224 overlap the plurality of main wirings 231B when seen in the Z direction. The areas A213, A214, A223, and A224 are located between the first sub-wiring and the second sub-wiring when seen in the Z direction. Note that the arrangement of the areas A213, A214, A223, and A224 is not limited to the example shown in FIG. 19.

The plurality of main wirings 231B are used to generate a second magnetic field. In the example shown in FIG. 19, each of the plurality of main wirings 231B extends in a direction parallel to the U direction. The first end is located forward of the plurality of main wirings 231B in the −U direction. The second end is located forward of the plurality of main wirings 231B in the U direction. When a current is flowed through the second conductor layer 230B from the first end to the second end, a direction of the current flowing through each of the plurality of main wirings 231B is the U direction, and the second magnetic field including a magnetic field component in the −V direction, as the second magnetic field component, is generated.

Next, the operation and effects of the magnetic sensor device 1 in the example embodiment will be described. The free layer 54 of each of the plurality of MR elements 50A constituting the resistor sections R11 to R14 of the first detection circuit 210 has a shape anisotropy in which the direction of the magnetization easy axis is a direction parallel to the Y direction. The magnetization direction of the free layer 54 in each of the resistor sections R11 and R12 is the Y direction when the target magnetic field (external magnetic field) is not applied to the first detection circuit 210. However, due to a noise magnetic field such as a disturbance magnetic field, the magnetization direction of the free layer 54 in each of the resistor sections R11 and R12 may be the −Y direction. In this case, if the first magnetic field is generated by the first conductor layer 230A of the magnetic field generator 3 and a magnetic field component in the V direction is temporarily applied to each of the resistor sections R11 and R12, the magnetization direction of the free layer 54 also becomes the V direction. Thereafter, when the generation of the first magnetic field is stopped, the magnetization direction of the free layer 54 in each of the resistor sections R11 and R12 becomes the Y direction.

Similarly, the magnetization direction of the free layer 54 in each of the resistor sections R13 and R14 is the −Y direction when no target magnetic field (disturbance magnetic field) is applied to the first detection circuit 210. However, due to an external magnetic field, the magnetization direction of the free layer 54 in each of the resistor sections R13 and R14 may be the Y direction. In this case, if the second magnetic field is generated by the second conductor layer 230B of the magnetic field generator 3 and a magnetic field component in the −V direction is temporarily applied to each of the resistor sections R13 and R14, the magnetization direction of the free layer 54 also becomes the −V direction. Then, when the generation of the second magnetic field is stopped, the magnetization direction of the free layer 54 in each of the resistor sections R13 and R14 becomes the −Y direction.

Thus, the magnetic field generator 3 in the example embodiment may be used to align the magnetization direction of the free layer 54 in each of the resistor sections R11 to R14 in a predetermined direction (Y or −Y direction), that is, may be used to set or reset the magnetization direction of the free layer 54.

The above description of the resistor sections R11 to R14 of the first detection circuit 210 also applies to the resistor sections R21 to R24 of the second detection circuit 220. The magnetic field generator 3 in the example embodiment is used to align the magnetization direction of the free layer 54 in each of the resistor sections R21 and R22 in the X direction and the magnetization direction of the free layer 54 in each of the resistor sections R23 and R24 in the −X direction.

Other configurations, operation, and effects in the example embodiment are the same as in the first example embodiment.

Fourth Example Embodiment

Next, a fourth example embodiment of the technology will be described. First, a brief description will be given of the points in which a configuration of a magnetic sensor device 1 according to the example embodiment differs from that of the third example embodiment. In the example embodiment, a magnetic sensor 202 and a magnetic field generator 3 are configured to be integrated into a single electronic component, and a processor 4 is configured to be an electronic component separate from the magnetic sensor 202 and the magnetic field generator 3. The electronic component that includes the magnetic sensor 202 and the magnetic field generator 3 is hereinafter referred to as an electronic component 205. The electronic component 205 is in a form of a rectangular parallelepiped chip, similar to the first electronic component 5 or the second electronic component 6 in the first example embodiment.

Figure 20:
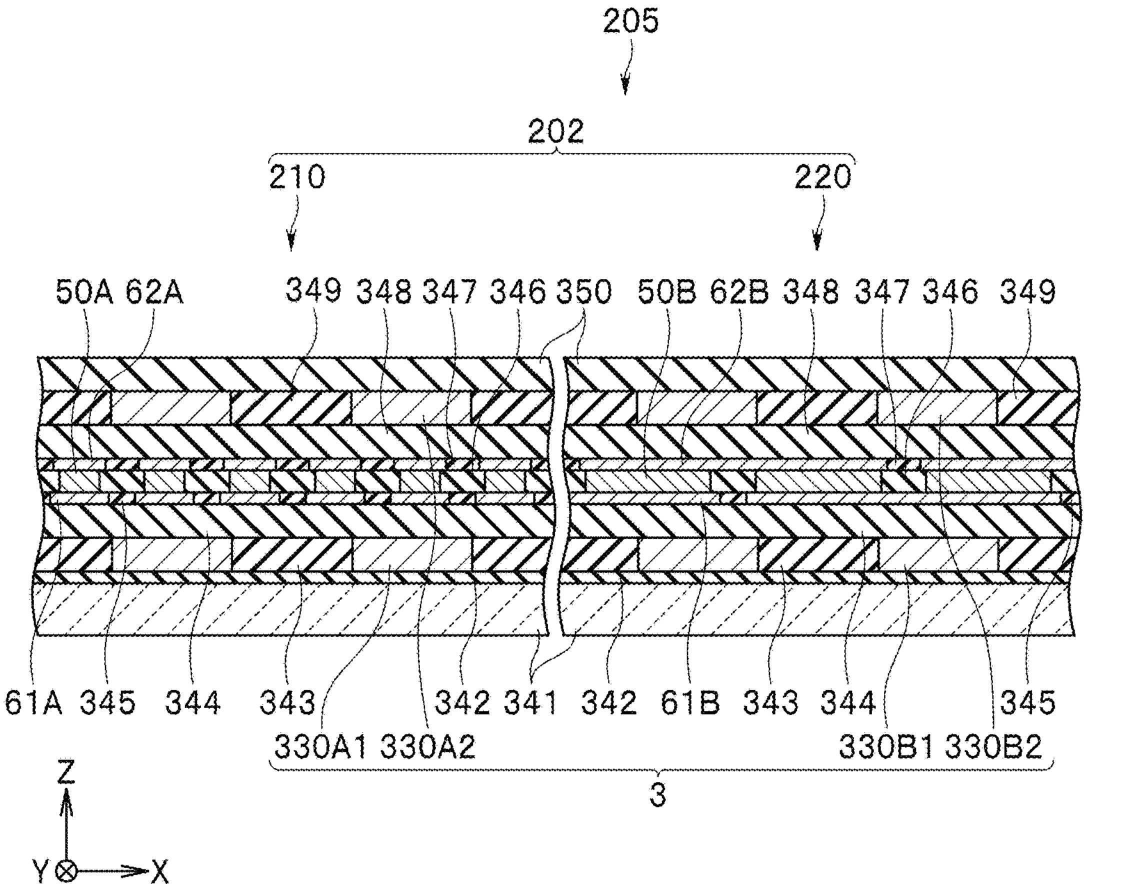
FIG. 20 is a cross-sectional showing an electronic component in a fourth example embodiment of the technology.

Next, a structure of the electronic component 205 will be described with reference to FIG. 20. FIG. 20 is a cross-sectional view showing the electronic component 205.

The magnetic field generator 3 includes two first conductor layers 330A1 and 330A2, each made of a conductive material, instead of the first conductor layer 230A in the third example embodiment. A shape of each of the first conductor layers 330A1 and 330A2 is similar to that of the first conductor layer 230A. The first conductor layers 330A1 and 330A2 are configured to generate a first magnetic field including a first magnetic field component to be applied to a part of each of the first and second detection circuits 210 and 220 of the magnetic sensor 202. The first conductor layers 330A1 and 330A2 are connected in series or parallel.

The magnetic field generator 3 also includes two second conductor layers 330B1 and 330B2, each made of a conductive material, instead of the second conductor layer 230B in the third example embodiment. A shape of each of the second conductor layers 330B1 and 330B2 is similar to that of the second conductor layer 230B. The second conductor layers 330B1 and 330B2 are configured to generate a second magnetic field including a second magnetic field component to be applied to another part of each of the first and second detection circuits 210 and 220 of the magnetic sensor 202. The second conductor layers 330B1 and 330B2 are connected in series or parallel.

The electronic component 205 includes a substrate 341 and insulating layers 342, 343, 344, 345, 346, 347, 348, 349, and 350. The insulating layer 342 is disposed on the substrate 341. The first conductor layer 330A1 and the second conductor layer 330B1 are disposed on the insulating layer 342. The insulating layer 343 is disposed around the first conductor layer 330A1 and around the second conductor layer 330B1 on the insulating layer 342. The insulating layer 344 is disposed on the first conductor layer 330A1, the second conductor layer 330B1, and the insulating layer 343.

As described in the third example embodiment, the first detection circuit 210 of the magnetic sensor 202 includes the plurality of MR elements 50A, the plurality of lower electrodes 61A, and the plurality of upper electrodes 62A. The second detection circuit 220 of the magnetic sensor 202 includes the plurality of MR elements 50B, the plurality of lower electrodes 61B, and the plurality of upper electrodes 62B. The plurality of lower electrodes 61A and the plurality of lower electrodes 61B are disposed on the insulating layer 344. The insulating layer 345 is disposed around the plurality of lower electrodes 61A and around the plurality of lower electrodes 61B on the insulating layer 344. The plurality of MR elements 50A are disposed on the plurality of lower electrodes 61A. The plurality of MR elements 50B are disposed on the plurality of lower electrodes 61B. The insulating layer 346 is disposed around the plurality of MR elements 50A and around the plurality of MR elements 50B on the plurality of lower electrodes 61A, the plurality of lower electrodes 61B, and the insulating layer 345.

The plurality of upper electrodes 62A are disposed on the plurality of MR elements 50A and the insulating layer 346. The plurality of upper electrodes 62B are disposed on the plurality of MR elements 50B and the insulating layer 346. The insulating layer 347 is disposed around the plurality of upper electrodes 62A and around the plurality of upper electrodes 62B on the insulating layer 346.

The insulating layer 348 is disposed on the plurality of upper electrodes 62A, the plurality of upper electrodes 62B, and the insulating layer 347. The first conductor layer 330A2 and the second conductor layer 330B2 are disposed on the insulating layer 348. The insulating layer 349 is disposed around the first conductor layer 330A2 and around the second conductor layer 330B2 on the insulating layer 348. The insulating layer 350 is disposed on the first conductor layer 330A2, the second conductor layer 330B2, and the insulating layer 349.

In the example embodiment, the plurality of MR elements 50A of the resistor sections R11 and R12 of the first detection circuit 210 and the plurality of MR elements 50B of the resistor sections R21 and R22 of the second detection circuit 220 are located between the first conductor layer 330A1 and the first conductor layer 330A2. The magnetic field generator 3 may include only one of the first conductor layers 330A1 and the first conductor layer 330A2.

In the example embodiment, the plurality of MR elements 50A of the resistor sections R13 and R14 of the first detection circuit 210 and the plurality of MR elements 50B of the resistor sections R23 and R24 of the second detection circuit 220 are located between the second conductor layer 330B1 and the second conductor layer 330B2. The magnetic field generator 3 may include only one of the second conductor layers 330B1 and 330B2.

Other configurations, operation, and effects in the example embodiment are the same as in the third example embodiment.

Fifth Example Embodiment

Figure 21:
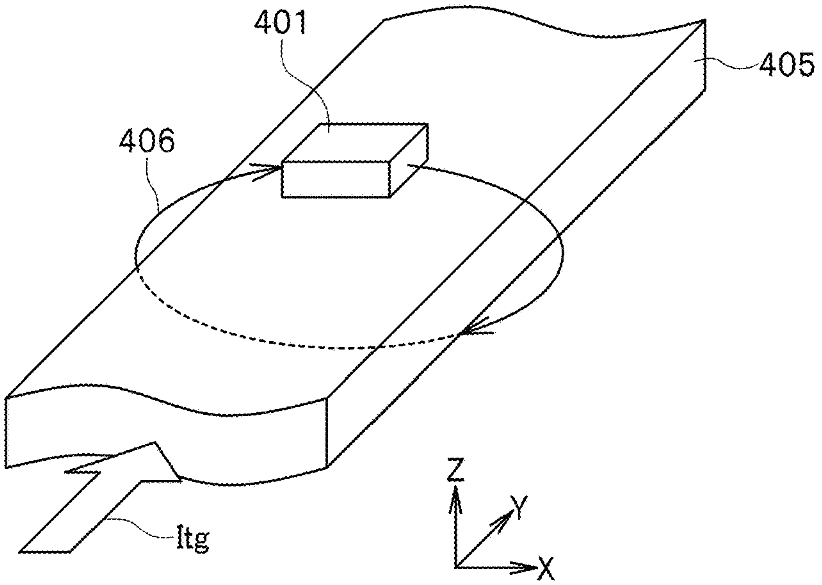
FIG. 21 is a perspective view showing a configuration of a current sensor system in a fifth example embodiment of the technology.

Next, a fifth example embodiment of the technology will be described. First, a configuration of a current sensor system including a magnetic sensor device according to the example embodiment will be described with reference to FIG. 21. A magnetic sensor device 401 according to the example embodiment is used as a current sensor device to detect the value of a current to be detected flowing through a conductor. FIG. 21 shows an example where the conductor through which the current to be detected flows is a bus bar 405. The magnetic sensor device 401 is disposed near the bus bar 405. The current to be detected is hereinafter referred to as a target current Itg. A magnetic field 406 is generated around the bus bar 405 by the target current Itg. The magnetic sensor device 401 is located at a position where the magnetic field 406 is applied.

Figure 22:
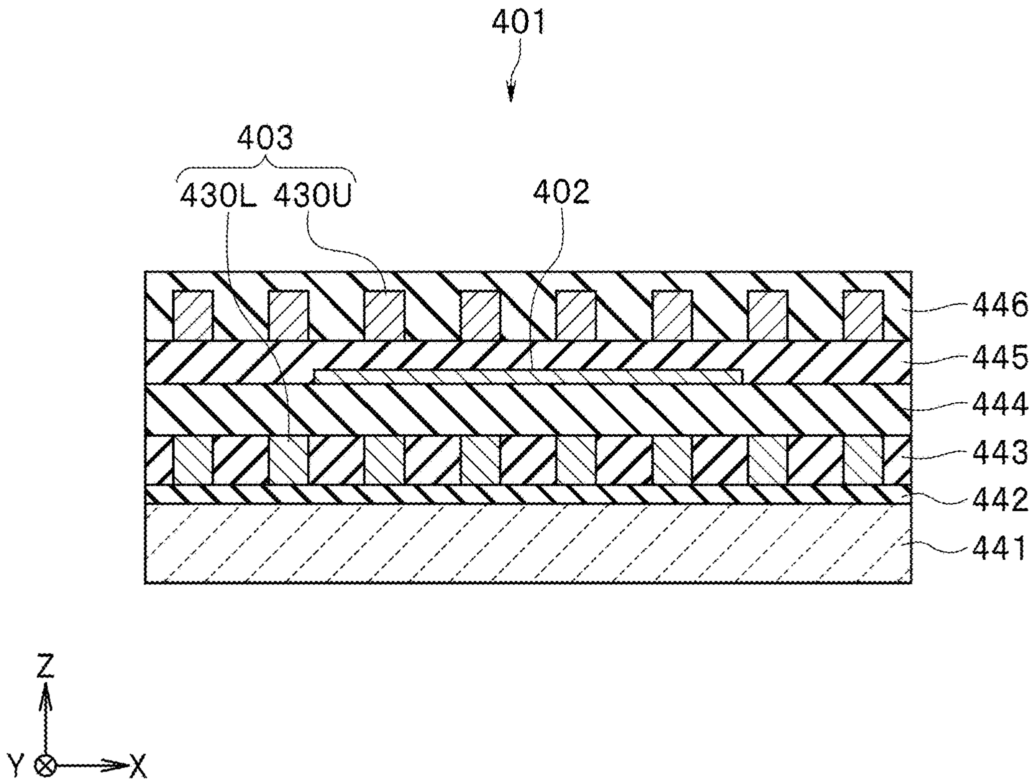
FIG. 22 is a cross-sectional view showing a magnetic sensor device according to the fifth example embodiment of the technology.

Next, a configuration of the magnetic sensor device 401 according to the example embodiment will be described with reference to FIG. 22. FIG. 22 is a cross-sectional view showing the magnetic sensor device 401. The magnetic sensor device 401 is a magnetic balance type current sensor device. As shown in FIG. 22, the magnetic sensor device 401 includes a magnetic sensor 402 and a magnetic field generator 403. The magnetic sensor 402 and the magnetic field generator 403 are integrated by a plurality of insulating layers as described below. The magnetic sensor device 401 is independent of the bus bar 405 (see FIG. 21).

Here, an X direction, a Y direction, and a Z direction are defined as shown in FIG. 21 and FIG. 22. The X, Y, and Z directions are orthogonal to each other. In the example embodiment, a direction in which the target current Itg shown in FIG. 21 flows is the Y direction.

Figure 23:
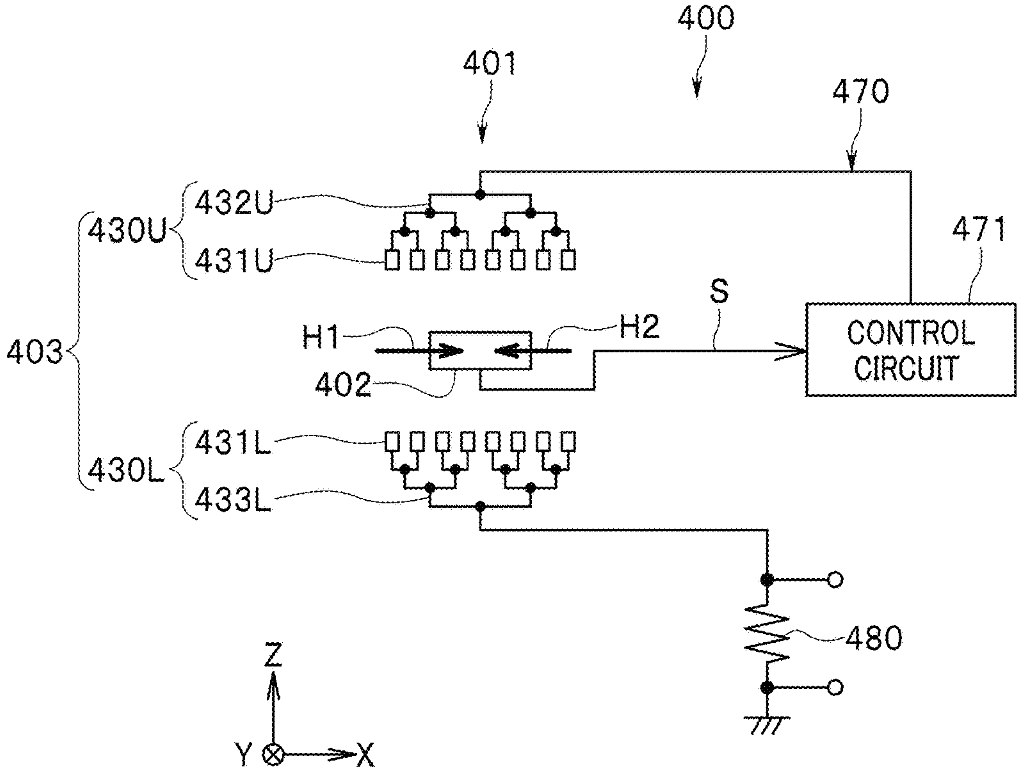
FIG. 23 is a block diagram showing a configuration of the current sensor system according to the fifth example embodiment of the technology.

Here, a magnetic field, which can be detected by the magnetic sensor 402, of the magnetic field 406 generated by the target current Itg is referred to as a first magnetic field H1. The magnetic field generator 403 is used to generate a second magnetic field H2 that cancels the first magnetic field H1. The magnetic sensor 402 is configured to detect a composite magnetic field of the first magnetic field H1 and the second magnetic field H2 as a target magnetic field, which is a magnetic field to be detected (detection target magnetic field). The magnetic sensor 402 is configured to generate a magnetic field detection value S according to the strength of the target magnetic field. The first magnetic field H1 and the second magnetic field H2 are shown in FIG. 23, which will be described later.

In the example embodiment, a direction of the first magnetic field H1, a direction of the second magnetic field H2, and a direction of the target magnetic field are parallel to the X direction. A configuration of the magnetic sensor 402 will be described in detail later.

The magnetic field generator 403 includes a first conductor layer 430L and a second conductor layer 430U each made of a conductive material. The first and second conductor layers 430L and 430U are configured to generate the second magnetic field H2. As shown in FIG. 22, the first and second conductor layers 430L and 430U are arranged to overlap the magnetic sensor 402 when seen in the Z direction. The first and second conductor layers 430L and 430U are connected in series or parallel.

Each of the first and second conductor layers 430L and 430U has the same structure as the first conductor layer 30A. That is, the first conductor layer 430L includes a first end, a second end, a plurality of main wirings 431L provided between the first end and the second end and separated from each other, a first sub-wiring electrically connecting the first end to the plurality of main wirings 431L, and a second sub-wiring 433L electrically connecting the second end to the plurality of main wirings 431L. The second conductor layer 430U includes a first end, a second end, a plurality of main wirings 431U provided between the first end and the second end and separated from each other, a first sub-wiring 432U electrically connecting the first end to the plurality of main wirings 431U, and a second sub-wiring electrically connecting the second end to the plurality of main wirings 431U. FIG. 22 shows shapes of the plurality of main wirings 431L and the plurality of main wirings 431U as shapes of the first and second conductor layers 430L and 430U. The main wiring 431L and 431U, the first sub-wiring 432U, and the second sub-wiring 433L are shown in FIG. 23, which will be described later.

As shown in FIG. 22, the magnetic sensor device 401 further includes a substrate 441 and insulating layers 442, 443, 444, 445, and 446. The insulating layer 442 is disposed on the substrate 441. The first conductor layer 430L is disposed on the insulating layer 442. The insulating layer 443 is disposed around the first conductor layer 430L on the insulating layer 442. The insulating layer 444 is disposed on the first conductor layer 430L and the insulating layer 443.

The magnetic sensor 402 is disposed on the insulating layer 444. The insulating layer 445 is disposed to cover the magnetic sensor 402 and the insulating layer 444. The second conductor layer 430U is disposed on the insulating layer 445. The insulating layer 446 is disposed to cover the second conductor layer 430U and the insulating layer 445.

Next, circuits connected to the magnetic sensor device 401 will be described with reference to FIG. 23. The magnetic sensor device 401 and the circuits connected to the magnetic sensor device 401 constitute the current sensor system 400. FIG. 23 is a block diagram showing a configuration of the current sensor system 400. As shown in FIG. 23, the current sensor system 400 includes the magnetic sensor device 401, a feedback circuit 470, and a current detector 480. The feedback circuit 470 controls a feedback current to generate the second magnetic field H2 according to the magnetic field detection value S and flows the controlled feedback current to the magnetic field generator 403. The current detector 480 generates a detection value of the feedback current flowing to the magnetic field generator 403. The current detector 480 is, for example, a resistor inserted in a current path of the feedback current. The potential difference between both ends of the resistor corresponds to the detection value of the feedback current. The detection value of the feedback current generated by the current detector 480 is hereinafter referred to as a current detection value. The current detection value is proportional to the value of the target current Itg. Therefore, the current detection value corresponds to the detection value of the target current Itg.

The feedback circuit 470 includes a control circuit 471. The control circuit 471 generates the feedback current controlled according to the magnetic field detection value S and supplies the controlled feedback current to the magnetic field generator 403.

Next, the configuration of the magnetic sensor 402 will be described in detail. The magnetic sensor 402 includes a plurality of magnetic detection elements. Each of the magnetic detection elements may be, for example, an MR element or a Hall element. The MR element may be a spin-valve MR element or an AMR (anisotropic magnetoresistive effect) element. In the example embodiment in particular, the magnetic sensor 402 includes a plurality of spin-valve MR elements 50 as the plurality of magnetic detection elements. A configuration of each of the plurality of MR elements 50 is the same as in the first example embodiment. Each of the plurality of MR elements 50 includes the magnetization pinned layer 52, the gap layer 53, and the free layer 54 as described in the first example embodiment. Each of the plurality of MR elements 50 may further include the antiferromagnetic layer 51 described in the first example embodiment.

Figure 24:
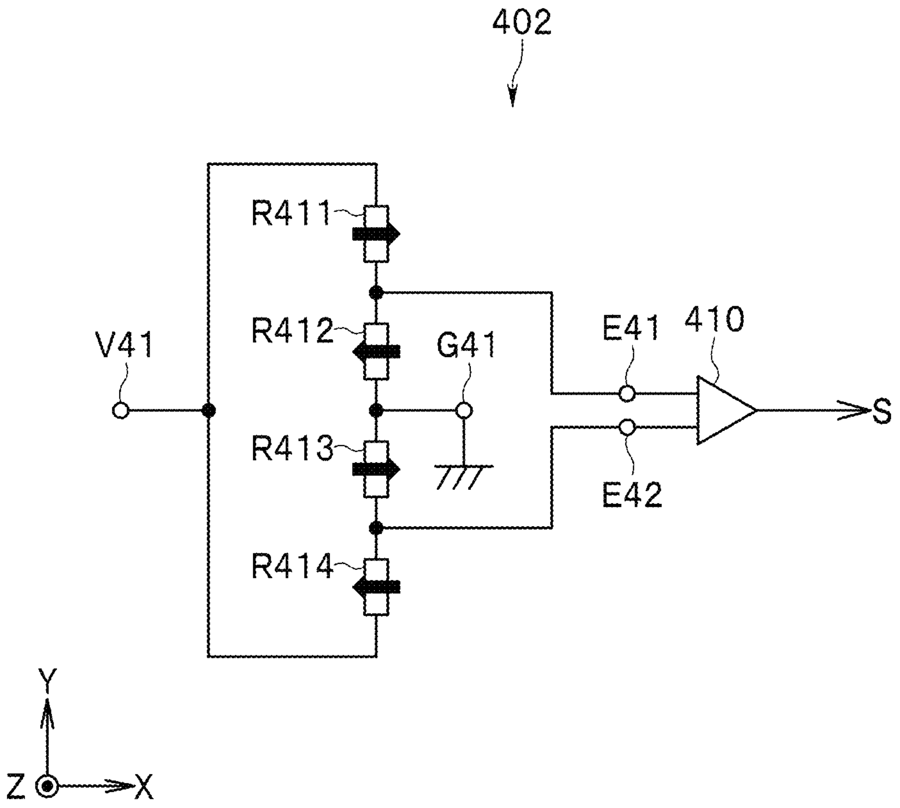
FIG. 24 is a circuit diagram showing a circuit configuration of a magnetic sensor in the fifth example embodiment of the technology.

FIG. 24 is a circuit diagram showing a circuit configuration of the magnetic sensor 402. The magnetic sensor 402 includes four resistor sections R411, R412, R413, and R414, a power supply port V41, a ground port G41, two output ports E41 and E42, and a difference detector 410. The resistor section R411 is provided between the power supply port V41 and the output port E41. The resistor section R412 is provided between the output port E41 and the ground port G41. The resistor section R413 is provided between the output port E42 and the ground port G41. The resistor section R414 is provided between the power supply port V41 and the output port E42. A voltage or current of a predetermined magnitude is applied to the power supply port V41. The ground port G41 is connected to the ground.

Each of the resistor sections R211 to R214 includes at least one MR element 50. In FIG. 24, the filled arrows represent the magnetization direction of the magnetization pinned layer 52 in each of the resistor sections R411 to R414. In the example shown in FIG. 24, the magnetization direction of the magnetization pinned layer 52 is set so that the magnetic sensing direction of the magnetic sensor 402 is parallel to the X direction in each of the resistor sections R411 to R414. The magnetization direction of the magnetization pinned layer 52 in each of the resistor sections R411 and R413 is the X direction. The magnetization direction of the magnetization pinned layer 52 in each of the resistor sections R412 and R414 is the –X direction. The free layer 54 in each of the resistor sections R411 to R414 has a shape anisotropy in which the direction of the magnetization easy axis is parallel to the Y direction.

A magnetic field 406 generated by the target current Itg and a magnetic field generated by the magnetic field generator 403 are applied to the magnetic sensor 402. The magnetic sensor 402 is located at a position where the directions of the above two magnetic fields that are applied are opposite or substantially opposite to each other, and is located in an orientation in which the above magnetic sensing direction is parallel or substantially parallel to the directions of the above two magnetic fields that are applied.

In this example, a component in the above magnetic sensing direction in the magnetic field generated by the target current Itg and applied to the magnetic sensor 402 is the first magnetic field H1. A component in the above magnetic sensing direction in the magnetic field generated by the magnetic field generator 403 and applied to the magnetic sensor 402 is the second magnetic field H2.

In the magnetic sensor 402, the potential difference between the output ports E41 and E42 changes according to the strength of the target magnetic field. The difference detector 410 outputs a signal corresponding to the potential difference between the output ports E41 and E42 as the magnetic field detection value S. The strength of the target magnetic field, the potential difference between the output ports E41 and E42, and the magnetic field detection value S can be a positive or negative value depending on a magnitude relationship between the first magnetic field H1 and the second magnetic field H2.

Other configurations, operation, and effects in the example embodiment are the same as in the first example embodiment.

Sixth Example Embodiment

Next, a sixth example embodiment of the technology will be described. In the example embodiment, a magnetic field generator is configured to generate a magnetic field for inspection of a magnetic sensor. The magnetic sensor to be inspected may be the magnetic sensor 2 in the first example embodiment, the magnetic sensor 202 in the third example embodiment, or the magnetic sensor 402 in the fifth example embodiment.

A configuration of the magnetic field generator in the example embodiment may be the same as the configuration of the magnetic field generator 3 in the first example embodiment, or the configuration of the magnetic field generator 3 in the third example embodiment. The magnetic field generator is configured to generate a magnetic field to be detected (target magnetic field) by the magnetic sensor as the magnetic field for inspection.

The magnetic field generator in the example embodiment is separate from the magnetic sensor and is arranged in a position and an orientation that enables the application of the magnetic field for inspection to the magnetic sensor. When the magnetic sensor to be inspected is the magnetic sensor 2 in the first example embodiment, the magnetic field generator 3 in the first example embodiment may be provided in addition to the magnetic field generator in the example embodiment. When the magnetic sensor to be inspected is the magnetic sensor 2 in the third example embodiment, the magnetic field generator 3 in the third example embodiment may be provided in addition to the magnetic field generator in the example embodiment.

Other configurations, operation, and effects in the example embodiments are the same as in the first, third or fifth example embodiments.

The technology is not limited to each of the above example embodiments, and various modifications are possible. For example, the magnetic sensor device of the technology may be configured such that each of the magnetic sensor, the magnetic field generator, and the processor is a separate electronic component.

The magnetic sensor device 1 according to the first example embodiment may be configured such that the first magnetic field component of the first magnetic field is applied to both the first detection circuit 10 and the second detection circuit 20, and that the second magnetic field component of the second magnetic field is applied to both the first detection circuit 10 and the second detection circuit 20.

The magnetic sensor device 1 of the third example embodiment may also constitute a part of a position detection device for detecting a position of an object moving in a predetermined direction. In this case, the magnetic sensor device 1 may be configured to detect a magnetic field generated by a magnet configured to change its relative position with respect to the object.

As described above, the magnetic sensor device according to one example embodiment of the technology includes the magnetic sensor and the magnetic field generator configured to generate a magnetic field to be applied to the magnetic sensor. The magnetic field generator includes the conductor layer made of a conductive material. The conductor layer includes the first end, the second end, the plurality of main wirings for generating the magnetic field, the plurality of main wirings provided between the first end and the second end and separated from each other, the first sub-wiring electrically connecting the first end to the plurality of main wirings, and the second sub-wiring electrically connecting the second end to the plurality of main wirings.

The first sub-wiring includes the plurality of first paths from the first end to each of the plurality of main wirings. The second sub-wiring includes the plurality of second paths from the second end to each of the plurality of main wirings. Each of the plurality of first paths passes through the plurality of first coupling portions from each of which the first sub-wiring branches off. Each of the plurality of second paths passes through the plurality of second coupling portions from each of which the second sub-wiring branches off. The number of the plurality of first coupling portions through with each of any two of the plurality of first paths passes is the same. The number of the plurality of second coupling portions through which each of any two of the plurality of second paths passes is the same, In the magnetic sensor device according to one example embodiment of the technology, the number of the plurality of first coupling portions through which each of the plurality of first paths passes is the same. The number of the plurality of second coupling portions through which each of the plurality of second paths passes is the same.

In the magnetic sensor device according to one example embodiment of the technology, each of the first sub-wiring and the second sub-wiring may be configured by electrically connecting the plurality of wiring portions, each of which does not branch off. Each of the plurality of first coupling portions and the plurality of second coupling portions may include at least one specific coupling portion to which three of the plurality of wiring portions are electrically connected. The plurality of first coupling portions and the plurality of second coupling portions may be both the specific coupling portions.

In the magnetic sensor device according to one example embodiment of the technology, the number of the plurality of main wirings may be n, and the sum of the number of the plurality of first coupling portions and the number of the plurality of second coupling portions may be 2 (n−1).

The magnetic sensor device according to one example embodiment of the technology may further include the first electronic component including the magnetic sensor and the second electronic component including the magnetic field generator. Alternatively, the magnetic sensor device according to one example embodiment of the technology may further include the electronic component including the magnetic sensor and the magnetic field generator.

In the magnetic sensor device according to one example embodiment of the technology, the magnetic sensor and the magnetic field generator may be stacked in the first direction. The magnetic sensor may include the plurality of magnetic detection elements. The plurality of magnetic detection elements may be located between the first sub-wiring and the second sub-wiring in the second direction orthogonal to the first direction when seen in the first direction.

In the magnetic sensor device according to one example embodiment of the technology, each of the plurality of main wirings may have a long shape in one direction and may include the one end closest to the first end and the other end closest to the second end. The potential difference between the one end and the other end of each of the plurality of main wirings may be the same.

In the magnetic sensor device according to one example embodiment of the technology, the conductor layer may include the plurality of paths, each having the same length, from the first end to the second end through the first sub-wiring, the plurality of main wirings, and the second sub-wiring.

In the magnetic sensor device according to one example embodiment of the technology, the conductor layer may include the plurality of paths, each having the same resistance, from the first end to the second end through the first sub-wiring, the plurality of main wirings, and the second sub-wiring.

In the magnetic sensor device according to one example embodiment of the technology, the conductor layer may have a symmetrical shape about the imaginary plane intersecting the first end and the second end.

In the magnetic sensor device according to one example embodiment of the technology, the plurality of main wirings may include the first main wiring, and the second main wiring and the third main wiring adjacent to the both sides of the first main wiring. The distance between the first main wiring and the second main wiring and the distance between the first main wiring and the third main wiring may be the same.

In the magnetic sensor device according to one example embodiment of the technology, the magnetic field may be used to measure the sensitivity of the magnetic sensor. Alternatively, in the magnetic sensor device of the technology, the magnetic sensor may include a magnetoresistive element. The magnetoresistive element may include the magnetic layer having the magnetization whose direction is variable. The magnetic field may be used to set or reset the magnetization direction of the magnetic layer.

The magnetic field generator according to one example embodiment of the technology is configured to generate the magnetic field for inspection to be applied to the magnetic sensor. The magnetic field generator includes the conductor layer made of a conductive material. The conductor layer includes the first end, the second end, the plurality of main wirings for generating the magnetic field, the plurality of main wirings provided between the first end and the second end and separated from each other, the first sub-wiring electrically connecting the first end to the plurality of main wirings, and the second sub-wiring electrically connecting the second end to the plurality of main wirings.

The first sub-wiring includes the plurality of first paths from the first end to each of the plurality of main wirings. The second sub-wiring includes the plurality of second paths from the second end to each of the plurality of main wirings. Each of the plurality of first paths passes through the plurality of first coupling portions from each of which the first sub-wiring branches off. Each of the plurality of second paths passes through the plurality of second coupling portions from each of which the second sub-wiring branches off. The number of the plurality of first coupling portions through which each of any two of the plurality of first paths passes is the same. The number of the plurality of second coupling portions through which each of any two of the plurality of second paths passes is the same.

In the magnetic sensor device and the magnetic field generator according to one example embodiment of the technology, the number of the plurality of first coupling portions through which each of any two of the plurality of first paths passes is the same, and the number of the plurality of second coupling portions through which each of any two of the plurality of second paths passes is the same. According to one example embodiment of the technology, this allows a uniform magnetic field to be applied to the magnetic sensor by the magnetic field generator.

Based on the above description, it is clear that various forms and variations of the technology can be implemented. Therefore, it is possible to implement the technology in forms other than the example embodiments described above within the scope of the appended claims and equivalents thereof.

The invention claimed is:

1. A magnetic sensor device comprising:
- a magnetic sensor; and
- a magnetic field generator configured to generate a magnetic field to be applied to the magnetic sensor, wherein
- the magnetic field generator includes a conductor layer made of a conductive material,
- the conductor layer includes:
  - a first end;
  - a second end;
  - a plurality of main wirings for generating the magnetic field, the plurality of main wirings provided between the first end and the second end and separated from each other;
  - a first sub-wiring electrically connecting the first end to the plurality of main wirings; and
  - a second sub-wiring electrically connecting the second end to the plurality of main wirings,
- the first sub-wiring includes a plurality of first paths from the first end to each of the plurality of main wirings,
- the second sub-wiring includes a plurality of second paths from the second end to each of the plurality of main wirings,
- each of the plurality of first paths passes through a plurality of first coupling portions from each of which the first sub-wiring branches off,
- each of the plurality of second paths passes through a plurality of second coupling portions from each of which the second sub-wiring branches off,
- the number of the plurality of first coupling portions through which each of any two of the plurality of first paths passes is the same, and
- the number of the plurality of second coupling portions through which each of any two of the plurality of second paths passes is the same.

2. The magnetic sensor device according to claim 1, wherein
- the number of the plurality of first coupling portions through which each of the plurality of first paths passes is all the same, and
- the number of the plurality of second coupling portions through which each of the plurality of second paths passes is all the same.

3. The magnetic sensor device according to claim 1, wherein
- each of the first sub-wiring and the second sub-wirings is configured by electrically connecting a plurality wiring portions, each of which does not branch off, and
- each of the plurality of first coupling portions and the plurality of second coupling portions includes at least one specific coupling portion to which three of the plurality of wiring portions are electrically connected.

4. The magnetic sensor device according to claim 3, wherein the plurality of first coupling portions and the plurality of second coupling portions are both the specific coupling portions.

5. The magnetic sensor device according to claim 1, wherein the number of the plurality of main wirings is n, and a sum of the number of the plurality of first coupling portions and the number of the plurality of second coupling portions is 2 (n−1).

6. The magnetic sensor device according to claim 1 further comprising:
- a first electronic component including the magnetic sensor; and
- a second electronic component including the magnetic field generator.

7. The magnetic sensor device according to claim 1 further comprising an electronic component including the magnetic sensor and the magnetic field generator.

8. The magnetic sensor device according to claim 1, wherein
- the magnetic sensor and the magnetic field generator are stacked in a first direction,
- the magnetic sensor includes a plurality of magnetic detection elements, and
- the plurality of magnetic detection elements are located between the first sub-wiring and the second sub-wiring in a second direction orthogonal to the first direction when seen in the first direction.

9. The magnetic sensor device according to claim 1, wherein
- each of the plurality of main wirings has a long shape in one direction and includes one end closest to the first end and another end closest to the second end, and
- a potential difference between the one end and the other end of each of the plurality of main wirings is the same.

10. The magnetic sensor device according to claim 1, wherein the conductor layer includes a plurality of paths from the first end to the second end through the first sub-wiring, the plurality of main wirings, and the second sub-wiring, each of the plurality of paths having a same length.

11. The magnetic sensor device according to claim 1, wherein the conductor layer includes a plurality of paths from the first end to the second end through the first sub-wiring, the plurality of main wirings, and the second sub-wiring, each of the plurality of paths having a same resistance.

12. The magnetic sensor device according to claim 1, wherein the conductor layer has a symmetrical shape about an imaginary plane intersecting the first end and the second end.

13. The magnetic sensor device according to claim 1, wherein the plurality of main wirings includes a first main wiring, and a second main wiring and a third main wiring adjacent to both sides of the first main wiring, and a distance between the first main wiring and the second main wiring and a distance between the first main wiring and the third main wiring are the same.

14. The magnetic sensor device according to claim 1, wherein the magnetic field is used to measure a sensitivity of the magnetic sensor.

15. The magnetic sensor device according to claim 1, wherein the magnetic sensor includes a magnetoresistive element, the magnetoresistive element includes a magnetic layer having a magnetization whose direction is variable, and the magnetic field is used to set or reset a direction of the magnetization of the magnetic layer.

16. A magnetic field generator configured to generate a magnetic field for inspection to be applied to a magnetic sensor, wherein the magnetic field generator includes a conductor layer made of a conductive material, the conductor layer includes:

a first end;

a second end;

a plurality of main wirings for generating the magnetic field, the plurality of main wirings provided between the first end and the second end and separated from each other;

a first sub-wiring electrically connecting the first end to the plurality of main wirings; and a second sub-wiring electrically connecting the second end to the plurality of main wirings, the first sub-wiring includes a plurality of first paths from the first end to each of the plurality of main wirings, the second sub-wiring includes a plurality of second paths from the second end to each of the plurality of main wirings, each of the plurality of first paths passes through a plurality of first coupling portions from each of which the first sub-wiring branches off, each of the plurality of second paths passes through a plurality of second coupling portions from each of which the second sub-wiring branches off, the number of the plurality of first coupling portions through which each of any two of the plurality of first paths passes is the same, and the number of the plurality of second coupling portions through which each of any two of the plurality of second paths passes is the same.

* * * * *